US010453380B2

(12) United States Patent
Okamoto et al.

(10) Patent No.: US 10,453,380 B2
(45) Date of Patent: Oct. 22, 2019

(54) SEMICONDUCTOR DEVICE AND TRANSMISSION SYSTEM

(71) Applicant: Semiconductor Energy Laboratory Co., Ltd., Atsugi-shi, Kanagawa-ken (JP)

(72) Inventors: Yuki Okamoto, Sagamihara (JP); Yoshiyuki Kurokawa, Sagamihara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 35 days.

(21) Appl. No.: 15/384,419

(22) Filed: Dec. 20, 2016

(65) Prior Publication Data

US 2017/0186364 A1 Jun. 29, 2017

(30) Foreign Application Priority Data

Dec. 28, 2015 (JP) .................. 2015-256595

(51) Int. Cl.
*G06T 9/00* (2006.01)
*G09G 3/20* (2006.01)
(Continued)

(52) U.S. Cl.
CPC ............. *G09G 3/2096* (2013.01); *G09G 3/36* (2013.01); *G09G 3/3648* (2013.01);
(Continued)

(58) Field of Classification Search
CPC ......... G09G 2320/103; G09G 2340/16; G09G 2330/022; H04N 19/61; H04N 19/60; G06T 9/00
See application file for complete search history.

(56) References Cited

U.S. PATENT DOCUMENTS 6,795,066 B2    9/2004   Tanaka et al.
7,058,228 B2 *  6/2006   Honda ................. H04N 19/172
                                                  375/E7.254
(Continued)

FOREIGN PATENT DOCUMENTS

CN        001368816 A     9/2002
CN        101894502 A     11/2010
(Continued)

OTHER PUBLICATIONS

International Search Report (Application No. PCT/IB2016/057755) dated Apr. 11, 2017.
(Continued)

*Primary Examiner* — Hau H Nguyen
(74) *Attorney, Agent, or Firm* — Robinson Intellectual Property Law Office; Eric J. Robinson

(57) ABSTRACT

A low power consumption semiconductor device is provided. The semiconductor device includes a decoder, a signal generation circuit, and a display device. The decoder includes an analysis circuit and an arithmetic circuit. The analysis circuit has a function of determining whether to decode the received first image data using the received data. The signal generation circuit has a function of generating a signal including an instruction on whether to decode the first image data in response to the determination of the analysis circuit. The arithmetic circuit has a function of decoding the first image data in response to the signal. The display device has a function of maintaining a second image displayed on the display device in the case where the first image data is not decoded in the arithmetic circuit.

8 Claims, 27 Drawing Sheets

(51) Int. Cl.
*G09G 3/36* (2006.01)
*H01L 27/12* (2006.01)
*H01L 29/786* (2006.01)

(52) U.S. Cl.
CPC ...... *H01L 27/1225* (2013.01); *H01L 29/7869* (2013.01); *G09G 2330/021* (2013.01); *G09G 2340/02* (2013.01); *G09G 2350/00* (2013.01); *G09G 2360/12* (2013.01); *G09G 2370/08* (2013.01)

(56) References Cited

U.S. PATENT DOCUMENTS

| | | | |
|---|---|---|---|
| 7,327,340 B2* | 2/2008 | Someya | G09G 3/2011 345/690 |
| 2002/0106198 A1 | 8/2002 | Suzuki | |
| 2007/0291131 A1 | 12/2007 | Suzuki et al. | |
| 2010/0220938 A1* | 9/2010 | Higuchi | G09G 3/3611 382/251 |
| 2010/0295839 A1 | 11/2010 | Nagaya et al. | |
| 2011/0063262 A1 | 3/2011 | Umezaki et al. | |
| 2011/0128461 A1 | 6/2011 | Koyama et al. | |
| 2011/0148846 A1 | 6/2011 | Arasawa et al. | |
| 2012/0063205 A1 | 3/2012 | Matsuzaki et al. | |
| 2012/0106226 A1 | 5/2012 | Saito | |
| 2012/0155150 A1 | 6/2012 | Nagatsuka et al. | |
| 2013/0114735 A1 | 5/2013 | Wang | |
| 2013/0114736 A1 | 5/2013 | Wang et al. | |
| 2014/0080253 A1* | 3/2014 | Yamazaki | H01L 29/7869 438/104 |
| 2014/0292741 A1 | 10/2014 | Yamazaki et al. | |
| 2015/0340076 A1 | 11/2015 | Yakubo et al. | |
| 2016/0006433 A1 | 1/2016 | Ishizu et al. | |
| 2016/0232956 A1 | 8/2016 | Ishizu et al. | |
| 2016/0295152 A1 | 10/2016 | Kurokawa | |
| 2016/0301932 A1 | 10/2016 | Kurokawa | |
| 2016/0379564 A1 | 12/2016 | Inoue et al. | |

FOREIGN PATENT DOCUMENTS

| | | |
|---|---|---|
| CN | 102640207 A | 8/2012 |
| EP | 1229742 A | 8/2002 |
| JP | 2002-232847 A | 8/2002 |
| JP | 2003-070002 A | 3/2003 |
| JP | 2010-271339 A | 12/2010 |
| JP | 2011-145667 A | 7/2011 |
| JP | 2013-008936 A | 1/2013 |
| JP | 2014-535220 | 12/2014 |
| KR | 2002-0065311 A | 8/2002 |
| KR | 2012-0046023 A | 5/2012 |
| KR | 2012-0094957 A | 8/2012 |
| TW | 522736 | 3/2003 |
| TW | 200534715 | 10/2005 |
| TW | 201133460 | 10/2011 |
| TW | 201230029 | 7/2012 |
| WO | WO-2005/076629 | 8/2005 |
| WO | WO-2011/074379 | 6/2011 |

OTHER PUBLICATIONS

Written Opinion (Application No. PCT/IB2016/057755) dated Apr. 11, 2017.

Onuki.T et al., "Fabrication of dynamic oxide semiconductor random access memory with 3.9 fF storage capacitance and greater than 1 h retention by using c-axis aligned crystalline oxide semiconductor transistor with L of 60nm", Jpn. J. Appl. Phys. (Japanese Journal of Applied Physics), 2015, vol. 54, pp. 04DD07-1-04DD07-5.

7.4.2.1 General NAL unit semantics / 7.4.2.2 NAL unit header semantics, ITU-T H.265(Apr. 2015), Apr. 1, 2015, pp. 61-65.

\* cited by examiner

FIG. 19A
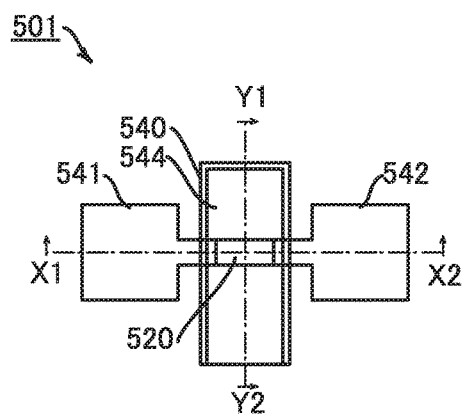
FIG. 19B
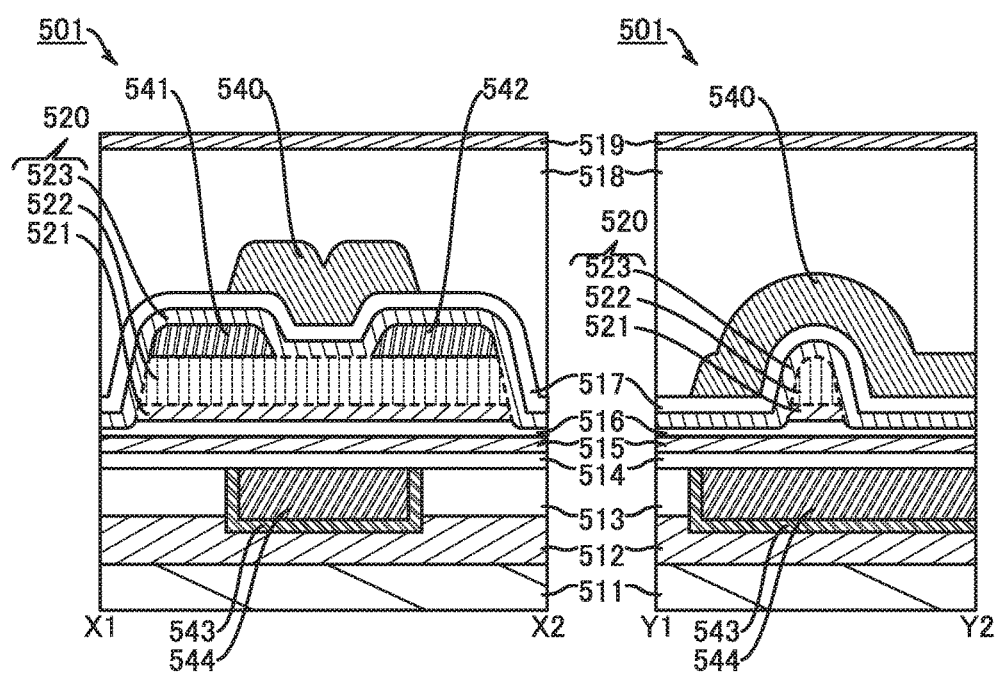
FIG. 19C

SEMICONDUCTOR DEVICE AND TRANSMISSION SYSTEM

TECHNICAL FIELD

One embodiment of the present invention relates to a semiconductor device and a transmission system using the semiconductor device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, a method for driving any of them, and a method for manufacturing any of them.

BACKGROUND ART

For satellite broadcasting, broadcasters perform encoding (encode) such as compression of image data before transmitting the image data because image data transmission is performed in a fixed broadcast band range. Patent Document 1 listed below discloses a structure for transmitting video data encoded through a channel between a source device and a destination device.

REFERENCE

Patent Document

[Patent Document 1] Japanese Translation of PCT International Application No. 2014-535220

DISCLOSURE OF INVENTION

As the resolution of image contents is increased, an encoding technology matching large-amount image data is being established. For example, ITU-T H. 265 (ISO/IEC 23008-2), which is a technique for high compression of image data, is employed as an international standard for broadcasting of ultra high definition television (UHD TV).

A data receiving semiconductor device performs arithmetic processing for decoding encoded image data and restoring its original data volume. Therefore, as the resolution of image contents is increased, the volume of the image data before encoding becomes large. Accordingly, a time for arithmetic processing for the encoding of the image data and power consumption for the arithmetic processing are increased.

In view of the foregoing technical background, an object of one embodiment of the present invention is to provide a semiconductor device capable of reducing a time for arithmetic processing. Alternatively, an object of one embodiment of the present invention is to provide a semiconductor device capable of reducing power consumption for arithmetic processing. Alternatively, an object of one embodiment of the present invention is to provide a semiconductor device capable of reducing its power consumption.

Alternatively, an object of one embodiment of the present invention is to provide a data transmission method and a data transmission system that are capable of reducing power consumption.

Note that an object of one embodiment of the present invention is to provide a novel semiconductor device or the like. Note that the descriptions of these objects do not disturb the existence of other objects. In one embodiment of the present invention, there is no need to achieve all the objects. Other objects will be apparent from and can be derived from the description of the specification, the drawings, the claims, and the like.

In one embodiment of the present invention, a first semiconductor device having a function as a transmitter has a function of obtaining difference information between a first image data and a second image data when encoding data. In addition, the first semiconductor device has functions of determining whether two pieces of image data are identical with each other or not using the above difference information and adding the data including the determination result to the encoded first image data. A second semiconductor device having a function as a receiver has a function of receiving the encoded first image data and the data of whether the first image data is identical with the second image data or not, and a function of analyzing the above data of whether they are identical or not and determining whether to decode the encoded first image data or not. In addition, the second semiconductor device has a function of generating a signal including an instruction on whether to perform arithmetic processing for decoding the encoded first image data in response to the above determination, and a function of performing the arithmetic processing in response to the signal. A display device included in the second semiconductor device has a function of displaying a first image using the decoded first image data that is obtained through the arithmetic processing.

Furthermore, the display device included in the second semiconductor device may have a function of maintaining a second image that is already displayed on the display device in the case where the first image data is not decoded in an arithmetic circuit.

Specifically, in a transmission system of one embodiment of the present invention, a first semiconductor device and a second semiconductor device are used. The first semiconductor device includes an encoder and a difference determination circuit. The second semiconductor device includes a decoder, a signal generation circuit, and a display device. The decoder includes an analysis circuit and an arithmetic circuit. The encoder has a function of obtaining difference information by comparing the first image data and the second image data, and a function of encoding the first image data using the difference information. The difference determination circuit has a function of generating data on whether the first image data and the second image data are identical with each other using the difference information and adding the data to the encoded first image data. The analysis circuit has a function of determining, using the data which is transmitted from the first semiconductor device, whether to decode the encoded first image data which is transmitted from the first semiconductor device. The signal generation circuit has a function of generating a signal including an instruction on whether to decode the encoded first image data in response to the determination of the analysis circuit. The arithmetic circuit has a function of decoding the encoded first image data in response to the signal. The display device has a function of maintaining a second image displayed on the display device in the case where the encoded first image data is not decoded in the arithmetic circuit.

Specifically, a semiconductor device of one embodiment of the present invention includes a decoder, a signal generation circuit, and a display device. The decoder includes an analysis circuit and an arithmetic circuit. The analysis circuit has a function of determining whether to decode the received first image data using the received data or not. The signal generation circuit has a function of generating a signal including an instruction on whether to decode the first image data in response to the determination of the analysis circuit. The arithmetic circuit has a function of decoding the first image data in response to the signal. The display device has a function of maintaining a second image displayed on the display device in the case where the first image data is not decoded in the arithmetic circuit.

In this specification and the like, a semiconductor device refers to a device that utilizes semiconductor characteristics, and means a circuit including a semiconductor element (e.g., a transistor or a diode), a device including the circuit, and the like. The semiconductor device also means any device that can function by utilizing semiconductor characteristics. For example, an integrated circuit, and a chip including an integrated circuit are semiconductor devices. Moreover, a storage device, a display device, a light-emitting device, a lighting device, an electronic device, and the like themselves might be semiconductor devices, or might each include a semiconductor device.

In this specification and the like, when it is explicitly described that X and Y are connected, the case where X and Y are electrically connected, the case where X and Y are functionally connected, and the case where X and Y are directly connected are included therein. Accordingly, without being limited to a predetermined connection relationship, for example, a connection relationship shown in drawings or texts, another connection relationship is included in the drawings or the texts. Here, X and Y each denote an object (e.g., a device, an element, a circuit, a line, an electrode, a terminal, a conductive film, a layer, or the like).

A transistor includes three terminals: a gate, a source, and a drain. The gate functions as a control node for controlling conduction of the transistor. Depending on the type of the transistor or levels of potentials applied to the terminals, one of two input/output nodes functions as a source and the other functions as a drain. Therefore, the terms "source" and "drain" can be interchanged with each other in this specification and the like. In this specification and the like, the two terminals except a gate are referred to as a first terminal and a second terminal.

A node can be referred to as a terminal, a wiring, an electrode, a conductive layer, a conductor, an impurity region, or the like depending on a circuit configuration, a device structure, or the like. Furthermore, a terminal, a wiring, or the like can be referred to as a node.

In many cases, voltage refers to a potential difference between a given potential and a reference potential (e.g., a ground potential (GND) or a source potential). Thus, voltage can be referred to as a potential. Note that the potential has a relative value. Accordingly, a ground potential does not necessarily mean 0 V.

In this specification and the like, the terms "film" and "layer" can be interchanged with each other depending on circumstances or conditions. For example, the term "conductive layer" can be changed into the term "conductive film" in some cases. The term "insulating film" can be changed into the term "insulating layer" in some cases, for example.

In this specification and the like, ordinal numbers such as "first," "second," and "third" are used to avoid confusion among components, and thus do not limit the number of components or do not limit the order.

One embodiment of the present invention can reduce a time required for arithmetic processing of a semiconductor device. Alternatively, one embodiment of the present invention can reduce power consumption required for arithmetic processing of a semiconductor device. Alternatively, one embodiment of the present invention can reduce power consumption of a semiconductor device.

Alternatively, one embodiment of the present invention can provide a data transmission method and a data transmission system that can reduce power consumption using the semiconductor device.

Note that one embodiment of the present invention can provide a novel semiconductor device or the like. The description of these effects does not preclude the existence of other effects. One embodiment of the present invention does not necessarily achieve all these effects. Other effects will be apparent from and can be derived from the description of the specification, the drawings, the claims, and the like.

BRIEF DESCRIPTION OF DRAWINGS

In the accompanying drawings:

FIGS. 19A to 19C illustrate a structure of a transistor;

BEST MODE FOR CARRYING OUT THE INVENTION

Figure 1:
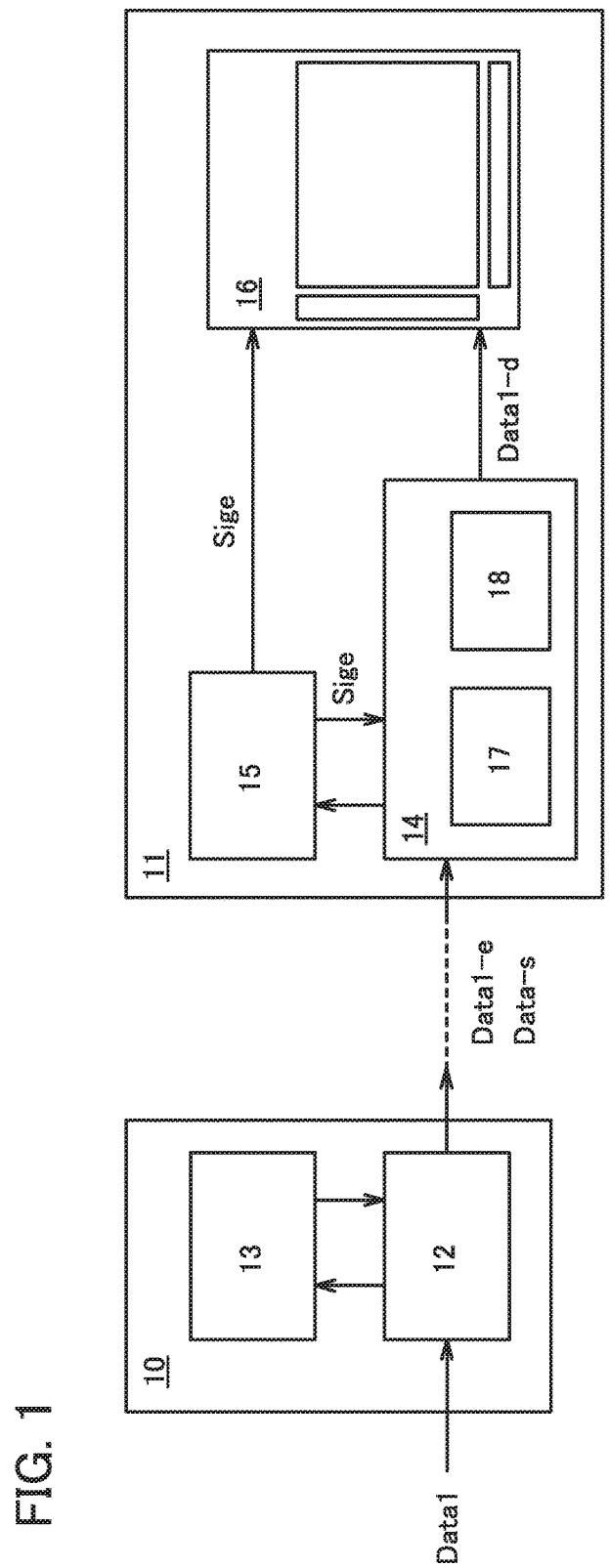
FIG. 1 illustrates one embodiment of a transmission system.

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Accordingly, the present invention should not be construed as being limited to the description of the embodiments below.

In the drawings, the size, the layer thickness, or the region is exaggerated for clarity in some cases. Thus, embodiments of the present invention are not limited to the such scales. Note that the drawings are schematic views showing ideal examples, and embodiments of the present invention are not limited to shapes or values shown in the drawings. For example, the following can be included: variation in signal, voltage, or current due to noise or difference in timing.

In this specification, terms for describing arrangement, such as "over," "above," "under," and "below," are used for convenience for describing the positional relationship between components with reference to drawings in some cases. Furthermore, the positional relationship between components is changed as appropriate in accordance with a direction in which each component is described. Thus, there is no limitation on terms used in this specification, and description can be made appropriately depending on the situation.

The positional relations of circuit blocks illustrated in a block diagram are specified for description. Even when a block diagram shows that different functions are achieved by different circuit blocks, one circuit block may be actually configured to achieve different functions. The functions of circuit blocks are specified for description, and even in the case where one circuit block is illustrated, circuit blocks might be provided in an actual circuit block so that processing performed by one circuit block is performed by a plurality of circuit blocks.

Embodiment 1

FIG. 1 illustrates an example of the configuration of a transmission system of one embodiment of the present invention. The transmission system illustrated in FIG. 1 includes a transmitter 10 and a semiconductor device 11. The transmitter 10 includes an encoder 12 and a difference determination circuit 13.

The encoder 12 has a function of comparing first image data (Data1) input to the transmitter 10 with reference image data and obtaining the difference information and a function of performing encoding such as compression for the first image data (Data1) using the difference information. The reference image data may be data of the same frame as that of the first image data (Data1). Alternatively, the reference image data may be data of a frame different from that of the first image data (Data1). Alternatively, the reference image data may be data generated using image data in a frame different from that of the first image data (Data1) and the difference information.

The difference determination circuit 13 has a function of determining, using the difference information, whether the first image data (Data1) is identical with the reference image data or not. The encoder 12 also has a function of adding data, obtained in the difference determination circuit 13, on whether the first image data (Data1) is identical with the reference image data or not (hereinafter, referred to as a comparison data (Data-s)) to the encoded first image data (Data1-$e$).

The semiconductor device 11 includes a decoder 14, a signal generation circuit 15, and a display device 16. The decoder 14 includes an analysis circuit 17 and an arithmetic circuit 18.

The analysis circuit 17 has a function of determining whether to decode the encoded first image data (Data1-$e$) which corresponds to the comparison data (Data-s) by analyzing the comparison data (Data-s) sent to the decoder 14 from the transmitter 10. Specifically, the analysis circuit 17 has a function of determining whether the encoded first image data (Data1-$e$) corresponding to the comparison data (Data-s) is identical with the reference image data which is input to the decoder 14 in advance of the first image data (Data1-$e$) by analyzing the comparison data (Data-s).

The signal generation circuit 15 has a function of generating a signal (Sige) including an instruction on whether to decode the first image data (Data1-$e$) in response to the determination in the analysis circuit 17. Note that FIG. 1 illustrates an example of the semiconductor device 11 in which the signal generation circuit 15 has a function of generating the signal (Sige); however, the decoder 14 may include a circuit having the above function.

The arithmetic circuit 18 has a function of decoding the first image data (Data1-$e$). The arithmetic circuit 18 performs the above arithmetic processing in response to the signal (Sige) generated in the signal generation circuit 15. Specifically, in the case where the analysis circuit 17 determines not to decode the first image data (Data1-$e$), the signal generation circuit 15 generates a signal (Sige) including an instruction not to decode the first image data (Data1-$e$) in response to the above determination of the analysis circuit 17. In this case, the arithmetic circuit 18 does not perform arithmetic processing for decoding the first image data (Data1-$e$) in response to the signal (Sige). In the case where the analysis circuit 17 determines to decode the first image data (Data1-$e$), the signal generation circuit 15 generates a signal (Sige) including an instruction to decode the first image data (Data1-$e$) in response to the above determination of the analysis circuit 17. In this case, the arithmetic circuit 18 performs arithmetic processing for decoding the first image data (Data1-$e$) in response to the signal (Sige).

The display device 16 has a function of updating image display using the image data in response to the signal (Sige). Specifically, when decoding of the first image data (Data1-$e$) is performed in the arithmetic circuit 18, the display device 16 has a function of displaying a first image using the decoded first image data (Data1-$d$) in response to the signal (Sige). In addition, when decoding of the first image data (Data1-$e$) is not performed in the arithmetic circuit 18, the display device 16 has a function of maintaining a second image which is already displayed on the display device 16 in response to the signal (Sige).

Note that the reference image data can be image data or the like which is input to the encoder 12 in advance of the first image data (Data1). When image data which is input to the encoder 12 in advance of the first image data (Data1) is referred to as a second image data (Data2), for example, the first image data (Data1) and the second image data (Data2) may correspond to the same frame period and correspond to pixels included in different areas. Alternatively, the first image data (Data1) and the second image data (Data2) may correspond to pixels included in the same area and correspond to different frame periods.

In one embodiment of the present invention, the above structure makes it possible to save the trouble of performing the same arithmetic processing in the arithmetic circuit 18 when the encoded first image data (Data1-e) is identical with the second image data (Data2-e), which is input to the encoder 12 in advance of the first image data (Data1) and then encoded. Accordingly, the arithmetic circuit 18 can reduce power consumption for the arithmetic processing. In addition, the display device 16 maintains display of the second image which is identical with the first image, so that power consumption for updating image display using image data can be reduced.

A specific configuration example of the display device 16 will be described later.

Figure 2:
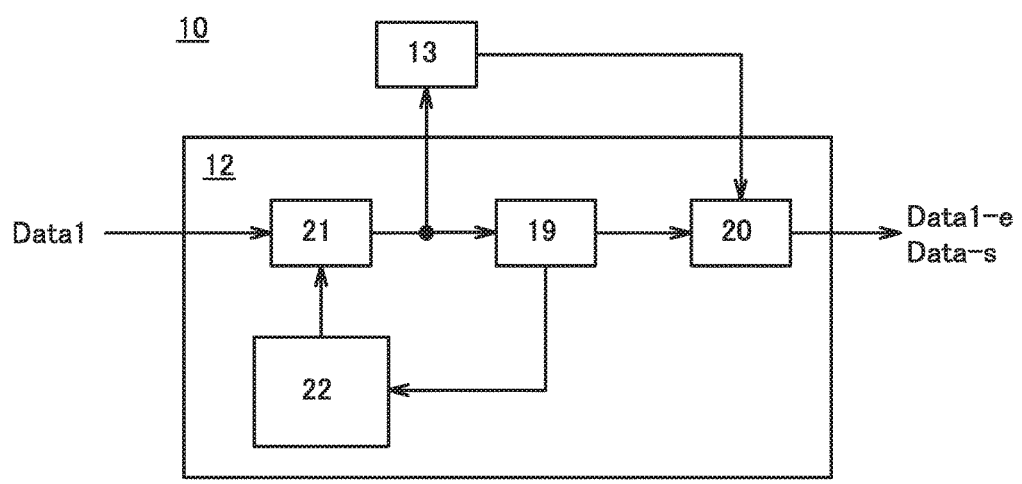
FIG. 2 illustrates one embodiment of a transmitter.

Next, a more specific configuration example of the transmitter 10 is illustrated in FIG. 2. The transmitter 10 illustrated in FIG. 2 includes the encoder 12 and the difference determination circuit 13. The encoder 12 includes a frame memory 22, a subtraction circuit 21, a signal processing circuit 19, and a header adding circuit 20.

The frame memory 22 has a function of storing reference image data. The subtraction circuit 21 has a function of comparing the first image data (Data1) input to the encoder 12 with the reference image data stored in the frame memory 22 and of calculating the difference information by the arithmetic processing. The signal processing circuit 19 has a function of performing encoding such as compression for the first image data (Data1) using the difference information calculated in the subtraction circuit 21.

In addition, the signal processing circuit 19 may have a function of generating reference imaging data anew using the above reference image data and the difference information. In this case, the reference imaging data generated in the signal processing circuit 19 is stored in the frame memory 22. Then, the subtraction circuit 21 compares the new reference image data with the first image data (Data1) input to the encoder 12 and then calculates the difference information by arithmetic processing.

In the case where the second image data (Data2) is input to the encoder 12 in advance of the first image data (Data1), the signal processing circuit 19 may have a function of generating the original second image data (Data2) by performing encoding and then decoding for the second image data (Data2) or a function of generating substantially the same image data as the original second image data (Data2) by performing encoding and then decoding for the second image data (Data2). In this case, substantially the same image data as the original second image data (Data2), which is generated in the signal processing circuit 19, is stored in the frame memory 22 as new reference image data. Then, the subtraction circuit 21 compares the reference image data with the first image data (Data1) input to the encoder 12 and then calculates the difference information by arithmetic processing.

Note that in the case where the first image data (Data1) and the second image data (Data2) correspond to pixels included in the same area and correspond to different frame periods, the reference image data generated in the signal processing circuit 19 on the basis of the second image data (Data2) is stored temporarily in the frame memory 22. When the first image data (Data1) is input to the encoder 12, the subtraction circuit 21 can compare the reference image data stored in the frame memory 22 with the first image data (Data1) and calculate the difference information by arithmetic processing.

In the case where the first image data (Data1) and the second image data (Data2) correspond to the same frame period and correspond to pixels included in different areas, the reference image data generated in the signal processing circuit 19 on the basis of the second image data (Data2) is not necessarily stored in the frame memory 22. In this case, the encoder 12 may be provided with a memory with a smaller circuit size than the frame memory 22 to store the reference image data generated in the signal processing circuit 19 on the basis of the second image data (Data2).

The difference determination circuit 13 has a function of determining, using the difference information, whether the first image data (Data1) is identical with the reference image data. The header adding circuit 20 has a function of adding attribute information of image data to encoded image data. In addition, the header adding circuit 20 has a function of adding the comparison data (Data-s), obtained in the difference determination circuit 13, on whether the first image data (Data1) is identical with the reference image data to the encoded first image data (Data1-e).

Figure 3:
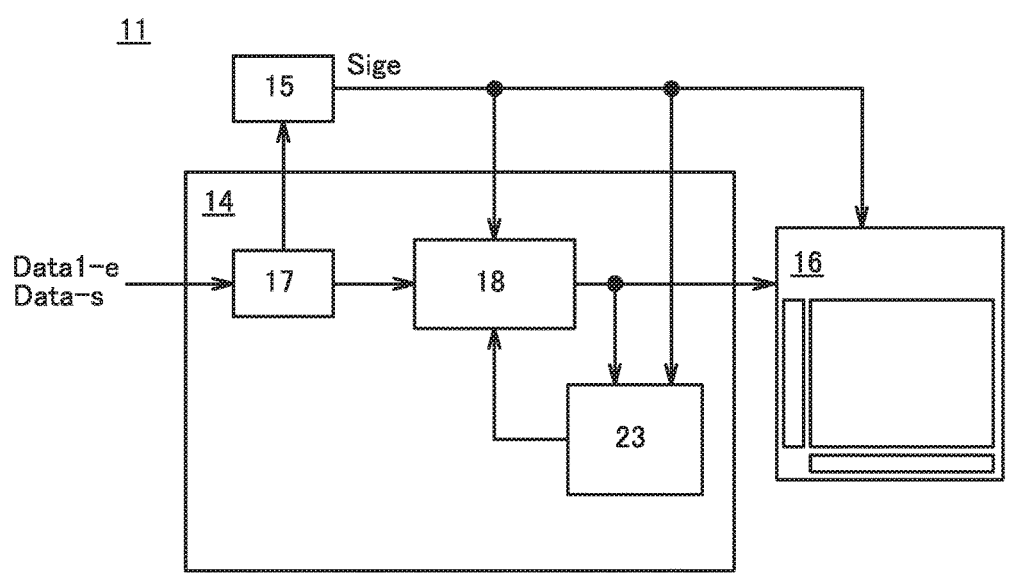
FIG. 3 illustrates one embodiment of a semiconductor device.

Next, a more specific configuration example of the semiconductor device 11 is illustrated in FIG. 3. The semiconductor device 11 illustrated in FIG. 3 includes the decoder 14, the signal generation circuit 15, and the display device 16. The decoder 14 includes the analysis circuit 17, the arithmetic circuit 18, and a frame memory 23. The frame memory 23 has a function of storing the first image data (Data1-d) that is decoded in the arithmetic circuit 18.

In the semiconductor device 11 illustrated in FIG. 3, a signal (Sige) including an instruction on whether to decode the first image data (Data1-e) which is generated in the signal generation circuit 15 is transmitted to the arithmetic circuit 18, the frame memory 23, and the display device 16. The arithmetic circuit 18 has a function of performing the arithmetic processing for decoding of the first image data (Data1-e) in response to the signal (Sige). The frame memory 23 has a function of writing and reading the decoded first image data (Data1-d) and writing and reading the reference image data in response to the signal (Sige). The display device 16 has a function of displaying the first image using the decoded first image data (Data1-d) in response to the signal (Sige). In addition, the display device 16 has a function of maintaining the second image which is already displayed on the display device 16 in response to the signal (Sige).

Note that in the case where the first image data (Data1) and the second image data (Data2) correspond to the same frame period and correspond to pixels included in different areas, the semiconductor device 11 may be provided with a memory with a smaller circuit size than the frame memory 23 to store the reference image data decoded in the arithmetic circuit 18 on the basis of the second image data (Data2) in a manner similar to the encoder 12.

Figure 4A:
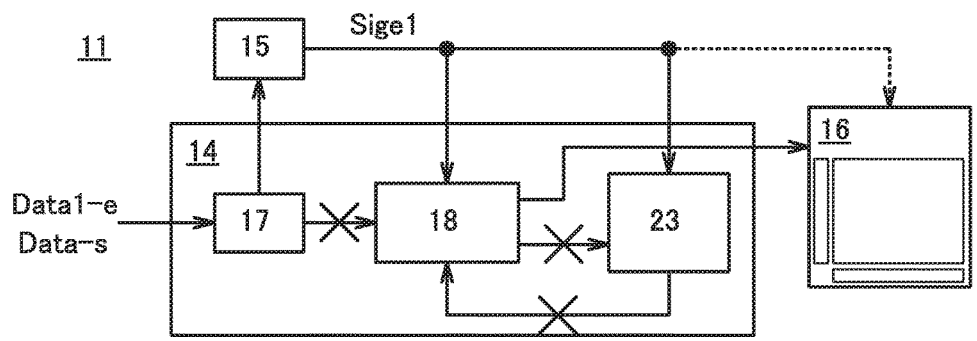
FIGS. 4A and 4B each illustrate an operation of a semiconductor device.
Figure 4B:
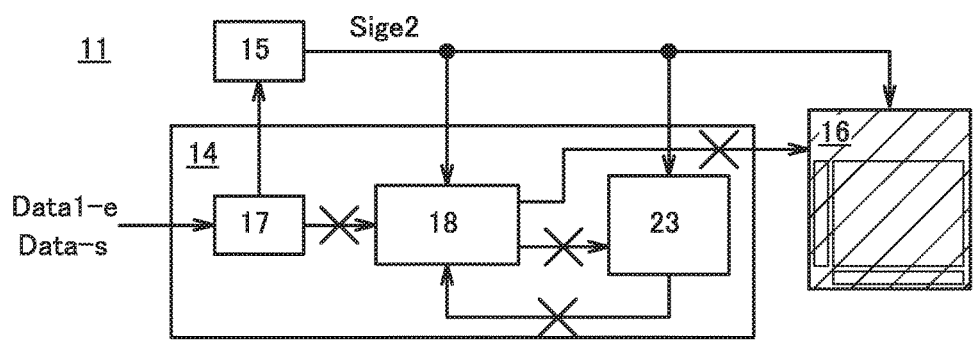

FIGS. 4A and 4B each show an example of switching operations of the arithmetic circuit 18, the frame memory 23, and the display device 16 in response to the signal (Sige).

First, in the case where the analysis circuit 17 determines not to decode the image data, the signal generation circuit 15 generates a first signal (Sige1) including an instruction not to decode the first image data in response to the above determination of the analysis circuit 17. Accordingly, as illustrated in FIG. 4A, the arithmetic circuit 18 stops the arithmetic processing for decoding of the first image data (Data1-e) in response to the first signal (Sige1).

In response to the first signal (Sige1), the frame memory 23 stops writing the image data in the frame memory 23 and reading the image data from the frame memory 23. Specifically, reading of the reference image data from the frame memory 23 is stopped. In addition, reading of the decoded image data (Data1-d) from the frame memory 23 is stopped.

Next, as illustrated in FIG. 4B, the display device 16 stops updating image display using image data in response to a second signal (Sige2) and maintains an image which is already displayed on the display device 16.

Then, in the case where an image signal and comparison data (Data-s) are input anew to the decoder 14 and the analysis circuit 17 determines to decode the image data, the signal generation circuit 15 generates the first signal (Sige1) including an instruction to decode the image data in response to the above determination of the analysis circuit 17. In this case, in response to the first signal (Sige1), the frame memory 23 restarts writing the image data in the frame memory 23 and reading the image data from the frame memory 23. Specifically, reading of the reference image data from the frame memory 23 is restarted. In addition, reading of the decoded image data from the frame memory 23 is restarted. The arithmetic circuit 18 restarts the arithmetic processing for decoding the image data in response to the first signal (Sige1).

Next, the display device 16 restarts updating image display using the decoded image data in response to the second signal (Sige2).

Note that although FIGS. 4A and 4B illustrate that operations of both the arithmetic circuit 18 and the frame memory 23 are controlled by the first signal (Sige1) and the second signal (Sige2), the operations of the arithmetic circuit 18 and the frame memory 23 may be controlled by different types of signals (Sige). In this case, when the analysis circuit 17 determines not to decode the image data, the operation of the frame memory 23 is preferably stopped after the operation of the arithmetic circuit 18 is stopped. When the analysis circuit 17 determines to decode the image data, the operation of the arithmetic circuit 18 is preferably restarted after the operation of the frame memory 23 is restarted.

This embodiment can be combined with any of the other embodiments as appropriate.

Embodiment 2

Next, configuration examples of a display device of one embodiment of the present invention will be described. The display device 16 illustrated in FIG. 5A includes a pixel portion 30, driver circuits 31, a driver circuit 32, a controller 37, and a frame memory 38.

The pixel portion 30 includes a plurality of pixels 33, wirings GL functioning as scan lines which are referred to as a wiring GL1 to a wiring GLy (y is a natural number), and wirings SL functioning as signal lines which are referred to as a wiring SL1 to a wiring SLx (x is a natural number). Each of the plurality of pixels 33 is electrically connected to at least one of the wirings GL and at least one of the wirings SL. Specifically, signals for selecting the pixels 33 in each row are input to the wirings GL1 to GLy. Image signals are input to the wirings SL1 to SLx. Image signals are supplied to the selected pixels 33. Each of the driver circuits 31 has a function of controlling the input of signals to the wirings GL. The driver circuit 32 has a function of controlling the input of image signals to the wirings SL.

Note that the kinds and number of the wirings in the pixel portion 30 can be determined by the structure, number, and position of the pixels 33. Specifically, in the pixel portion 30 illustrated in FIG. 5A, the pixels 33 are arranged in a matrix of x columns and y rows, and the wirings SL1 to SLx and the wirings GL1 to GLy are provided in the pixel portion 30 as an example.

The controller 37 has a function of generating various kinds of control signals such as clock signals and start pulse signals for controlling the operations of the driver circuits 31 and the driver circuit 32 in response to a vertical synchronization signal (Vsync) and a horizontal synchronization signal (Hsync). The frame memory 38 has a function of storing the decoded image data (Data-d) which is input to the display device 16. The controller 37 has a function of generating, using the image data (Data-d) stored in the frame memory 38, an image signal (Vsig) meeting the specifications of the pixel portion 30, the driver circuits 31, and the driver circuit 32.

Note that any one or more of the driver circuits 31, the driver circuit 32, and the controller 37 may be formed over a substrate where the pixel portion 30 is formed. Alternatively, all of the driver circuits 31, the driver circuit 32, and the controller 37 may be formed over a substrate different from a substrate where the pixel portion 30 is formed. Alternatively, the driver circuits 31, the driver circuit 32, or the controller 37 may be partly formed over a substrate different from a substrate where the pixel portion 30 is formed.

Note that, in this specification and the like, the term "connection" means electrical connection and corresponds to the case of a circuit configuration in which current, voltage, or a potential can be supplied or transmitted. Therefore, a circuit configuration in which connection is made does not necessarily refer to a state of direct connection, and also includes a circuit configuration in which connection is indirectly made through an element such as a wiring, a resistor, a diode, or a transistor so that current, voltage, or a potential can be supplied or transmitted. In addition, even when different components are connected to each other in a circuit diagram, there is actually a case where one conductive film has functions of a plurality of components, such as a case where part of a wiring serves as an electrode, for example. The term "connection" in this specification and the like also means such a case where one conductive film has functions of a plurality of components.

Figure 5A:
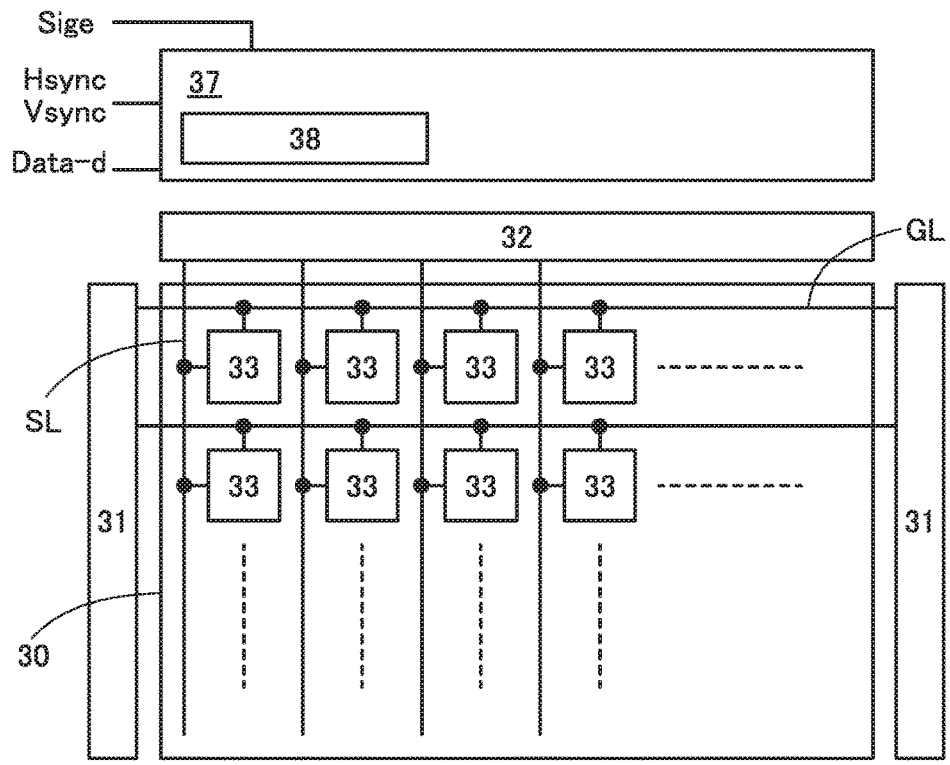
FIGS. 5A to 5C illustrate structures of a display device.
Figure 5B:
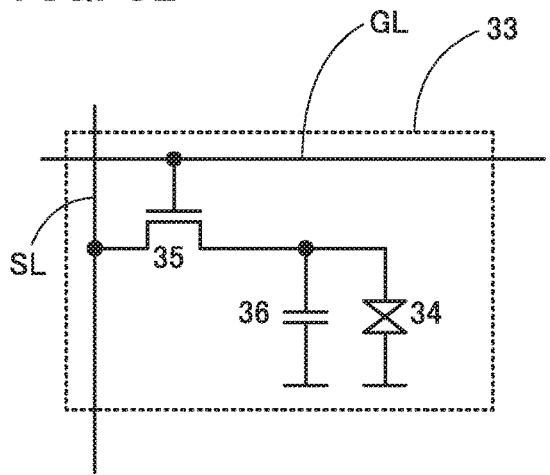

In addition, FIG. 5B illustrates an example of a structure of the pixel 33. Each of the pixels 33 includes a liquid crystal element 34, a transistor 35 that has a function of controlling the supply of an image signal to the liquid crystal element 34, and a capacitor 36 that has a function of holding voltage between a pixel electrode and a common electrode of the liquid crystal element 34. The liquid crystal element 34 includes a pixel electrode, a common electrode, and a liquid crystal layer which contains a liquid crystal material and to which voltage is applied across the pixel electrode and the common electrode.

The transistor 35 has a function of controlling whether to apply the potential of the wirings SL to the pixel electrode of the liquid crystal element 34. A predetermined potential is applied to the common electrode of the liquid crystal element 34.

The connection state between the transistor 35 and the liquid crystal element 34 will be specifically described below. In FIG. 5B, a gate of the transistor 35 is electrically connected to any one of the wirings GL1 to GLy. One of a source and a drain of the transistor 35 is electrically connected to any one of the wirings SL1 to SLx, and the other is electrically connected to the pixel electrode of the liquid crystal element 34.

Note that a "source" of a transistor means a source region that is part of a semiconductor film functioning as an active layer or means a source electrode connected to the semiconductor film. Similarly, a "drain" of a transistor means a drain region that is part of the semiconductor film or means a drain electrode connected to the semiconductor film. In addition, a "gate" means a gate electrode.

The names of the source and the drain of a transistor interchange with each other depending on the conductivity type of the transistor or levels of potentials applied to the terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, although connection relation of the transistor is described assuming that the source and the drain are fixed for convenience in some cases, actually, the names of the source and the drain interchange with each other depending on the relation of the potentials.

The transmittance of the liquid crystal element 34 changes when the alignment of liquid crystal molecules included in the liquid crystal layer changes in accordance with the level of voltage applied between the pixel electrode and the common electrode. Accordingly, when the transmittance of the liquid crystal element 34 is controlled by the potential of an image signal applied to the pixel electrode, gray-scale images can be displayed. In each of the plurality of pixels 33 included in the pixel portion 30, the gray level of the liquid crystal element 34 is adjusted in response to an image signal; thus, an image is displayed on the pixel portion 30.

FIG. 5B shows an example in which one transistor 35 is used as a switch for controlling the input of an image signal to the pixel 33. However, a plurality of transistors functioning as one switch may be used in the pixel 33.

Figure 5C:
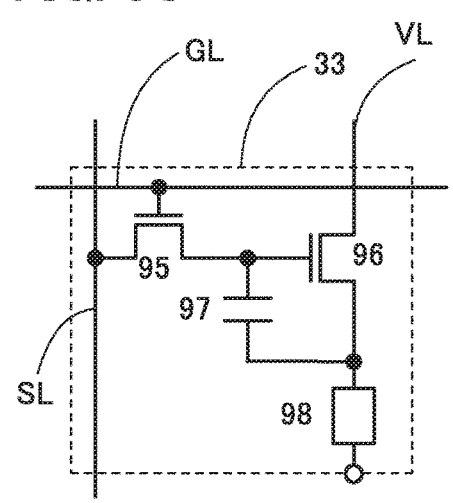

FIG. 5C shows another example of the pixel 33. The pixel 33 includes a transistor 95 for controlling input of an image signal to the pixel 33, a light-emitting element 98, a transistor 96 for controlling the value of current supplied to the light-emitting element 98 in response to an image signal, and a capacitor 97 for holding the potential of an image signal.

Examples of the light-emitting element 98 include an element whose luminance is controlled by current or voltage, such as a light-emitting diode (LED) or an organic light-emitting diode (OLED). For example, an OLED includes at least an EL layer, an anode, and a cathode. The EL layer is formed using a single layer or a plurality of layers provided between the anode and the cathode, at least one of which is a light-emitting layer containing a light-emitting substance.

From the EL layer, electroluminescence is obtained by current supplied when a potential difference between the cathode and the anode is higher than or equal to the threshold voltage of the light-emitting element 98. As electroluminescence, there are luminescence (fluorescence) at the time of returning from a singlet-excited state to a ground state and luminescence (phosphorescence) at the time of returning from a triplet-excited state to a ground state.

The potential of one of the anode and the cathode of the light-emitting element 98 is controlled in response to an image signal input to the pixel 33. The one of the anode and the cathode whose potential is controlled in response to an image signal is used as a pixel electrode, and the other is used as a common electrode. A predetermined potential is applied to the common electrode of the light-emitting element 98, and the luminance of the light-emitting element 98 is determined by a potential difference between the pixel electrode and the common electrode. Accordingly, when the luminance of the light-emitting element 98 is controlled by the potential of the image signal, gray-scale images can be displayed. In each of the plurality of pixels 33 included in the pixel portion, the gray level of the light-emitting element 98 is adjusted in response to an image signal containing image information; thus, an image is displayed on the pixel portion 30.

Next, connection between the transistor 95, the transistor 96, the capacitor 97, and the light-emitting element 98 which are included in the pixel 33 is described.

One of a source and a drain of the transistor 95 is connected to the wiring SL, and the other is connected to a gate of the transistor 96. A gate of the transistor 95 is connected to the wiring GL. One of a source and a drain of the transistor 96 is connected to a power supply line VL, and the other is connected to the light-emitting element 98. Specifically, the other of the source and the drain of the transistor 96 is connected to one of the anode and the cathode of the light-emitting element 98. A predetermined potential is applied to the other of the anode and the cathode of the light-emitting element 98.

The transistor 96 in FIG. 5C may include a pair of gate electrodes overlapping with each other with a semiconductor film provided therebetween. The pair of gate electrodes are electrically connected to each other. In one embodiment of the present invention, the above structure allows the on-state current and the reliability of the transistor 96 to be increased.

In one embodiment of the present invention, the display device 16 has a function of maintaining an image which is displayed on the pixel portion 30 in response to the signal (Sige). Specifically, in one embodiment of the present invention, the controller 37 has a function of stopping the writing of the decoded image data (Data-d) to the frame memory 38 in response to the signal (Sige). The controller 37 generates the image signal (Vsig) using the image data (Data-d) which is already stored in the frame memory 38; accordingly, the same image signal (Vsig) is written to the pixel portion 30, so that the image that has been displayed on the pixel portion 30 can be maintained.

Alternatively, in one embodiment of the present invention, the controller 37 may control its functions of generating a control signal and an image signal (Vsig) to perform or stop in response to the signal (Sige). When the functions of the controller 37 of generating an image signal (Vsig) and a control signal are stopped in response to the signal (Sige), the update of display of the image using the image data is stopped in the display device 16. The above configuration makes it possible to maintain an image that has been displayed on the pixel portion 30. Then, when the performing the functions of the controller 37 of generating an image signal (Vsig) and a control signal are started again, the update of display of the image using the decoded image data is started again in the display device 16.

Note that the transistors 35 and 95 with significantly low off-state current are preferably used as switches for controlling the input of image signals to the pixel 33 in order that a displayed image is maintained by stopping the update of display of the image using the image data. With the transistor 35 or 95 having significantly low off-state current, leakage of charge through the transistor 35 or 95 can be prevented. Thus, when the pixel 33 illustrated in FIG. 5B is used, for example, the potential of the image signal applied to the liquid crystal element 34 and the capacitor 36 can be held more reliably. Therefore, changes in transmittance of the liquid crystal element 34 due to leakage of charge in one frame period are prevented, so that the quality of an image to be displayed can be improved. In addition, since leakage of charge through the transistors 35 and 95 can be prevented when the transistors 35 and 95 have low off-state current, the supply of a power supply potential or a signal to the driver circuits 31 and 32 may be stopped in the case where the arithmetic processing is stopped in the arithmetic circuit 18. With the above configuration, the number of times of writing image signals to the pixel portion 30 can be reduced, and thus power consumption of the display device can be reduced.

To reduce off-state current of a transistor, a channel formation region contains a semiconductor with a wide energy gap, for example. The energy gap of the semiconductor is preferably greater than or equal to 2.5 eV, greater than or equal to 2.7 eV, or greater than or equal to 3 eV. An example of such a semiconductor material is an oxide semiconductor. As the transistor 35, a transistor including an oxide semiconductor in its channel formation region (OS transistor) can be used. The leakage current of an OS transistor normalized by the channel width can be lower than or equal to $10 \times 10^{-21}$ A/µm (10 zA/µm) with a source-drain voltage of 10 V at room temperature (approximately 25° C.). It is preferable that the leakage current of the OS transistor used as the transistors 35 and 95 be lower than or equal to $1 \times 10^{-18}$ A, lower than or equal to $1 \times 10^{-21}$ A, or lower than or equal to $1 \times 10^{-24}$ A at room temperature (approximately 25° C.). Alternatively, the leakage current is preferably lower than or equal to $1 \times 10^{-15}$ A, lower than or equal to $1 \times 10^{-18}$ A, or lower than or equal to $1 \times 10^{-21}$ A at 85° C.

Avalanche breakdown or the like is less likely to occur in some cases in a transistor including an oxide semiconductor in its channel formation region than in a general transistor including silicon or the like because an oxide semiconductor has a wide energy gap and thus electrons are less likely to be excited, and the effective mass of a hole is large. Since hot-carrier degradation or the like due to the avalanche breakdown is inhibited, the transistor including an oxide semiconductor in its channel formation region has high drain withstand voltage and can be driven at high drain voltage.

An oxide semiconductor contained in a channel formation region of a transistor is preferably an oxide semiconductor containing at least one of indium (In) and zinc (Zn). Typical examples of such an oxide semiconductor include an In oxide, a Zn oxide, an In—Zn oxide, and an In-M-Zn oxide (M is Al, Ti, Ga, Y, Zr, La, Ce, Nd, or Hf). Reductions in impurities serving as electron donors, such as hydrogen, and in oxygen vacancies can make an oxide semiconductor almost i-type (intrinsic) or substantially i-type. Here, such an oxide semiconductor can be referred to as a highly purified oxide semiconductor.

An oxide semiconductor with low carrier density is preferably formed for a channel formation region. The carrier density of the oxide semiconductor is preferably less than $8 \times 10^{11}/cm^3$ and greater than or equal to $1 \times 10^{-9}/cm^3$. The carrier density is preferably less than $1 \times 10^{11}/cm^3$, and further preferably less than $1 \times 10^{10}/cm^3$.

A highly purified intrinsic or substantially highly purified intrinsic oxide semiconductor has few carrier generation sources, and thus can have a low carrier density. The highly purified intrinsic or substantially highly purified intrinsic oxide has a low density of defect states, and thus also has a low density of trap states in some cases. Charge trapped by the trap states in the oxide semiconductor takes a long time to be dissipated and may behave like fixed charge. Thus, a transistor whose channel formation region is formed using an oxide semiconductor with a high density of trap states has unstable electrical characteristics in some cases.

Accordingly, in order to obtain stable electrical characteristics of the transistor including an oxide semiconductor in its channel formation region, it is effective to reduce the concentration of impurities in the channel formation region. To reduce the concentration of impurities in the channel formation region, the concentration of impurities in a region that is adjacent to the channel formation region is preferably reduced. Examples of the impurities of the oxide semiconductor include hydrogen, nitrogen, carbon, silicon, alkali metal, alkaline earth metal, and the like.

Next, an operation example of the display device 16 in FIG. 5A including the pixel 33 in FIG. 5B will be described. In the example, the update of display of image using image data is stopped and the displayed image is maintained.

Figure 6:
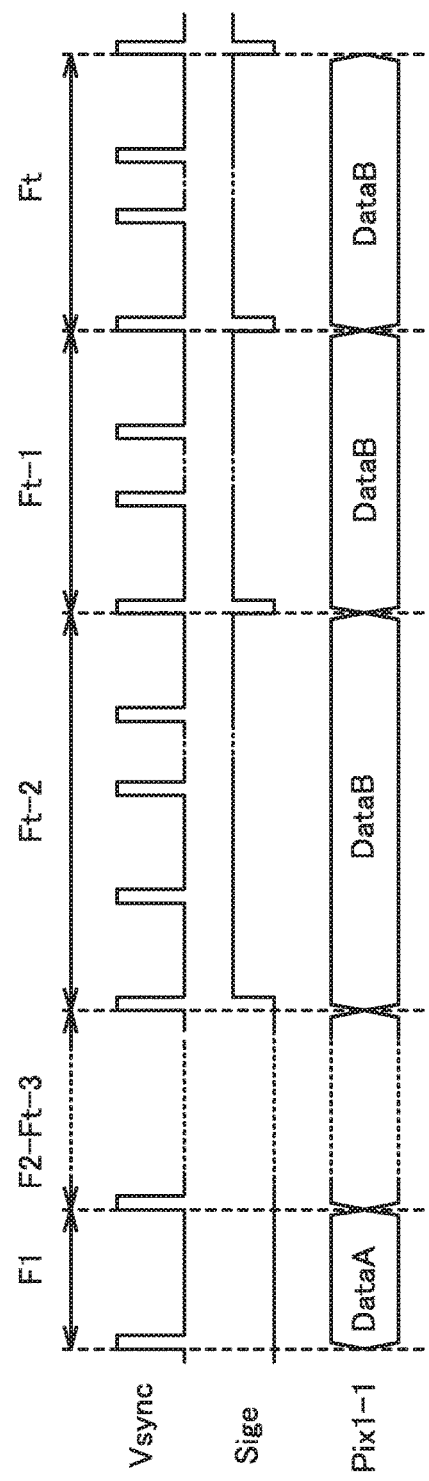
FIG. 6 illustrates an operation of a display device.

FIG. 6 illustrates changes over time in the potential of the vertical synchronization signal (Vsync) and changes over time in the potential of the signal (Sige) for controlling the operation of the display device 16, from the first frame period (F1) to the t-th frame period (Ft) (t is a natural number of 6 or more). A pixel electrically connected to the wiring GL1 and to the wiring SL1 is referred to as a pixel (Pix1-1). FIG. 6 also illustrates image data corresponding to the image signal written to the pixel (Pix1-1). The vertical synchronization signal (Vsync) can determine the length of the shortest frame period.

First, the operation of the pixel portion 30 from the first frame period (F1) to the (t−3)-th frame period (Ft−3) will be described.

When the first frame period (F1) is started in response to a pulse of the vertical synchronization signal (Vsync), a signal having a pulse is input to the wiring GL1, whereby the wiring GL1 is selected. In each of the plurality of pixels 33 connected to the selected wiring GL1, the transistor 35 is turned on. In a period during which the transistor 35 is on (in one line period), the potential of an image signal is applied to each of the wirings SL1 to SLx. In response to the potential of the image signal applied to each of the wirings SL1 to SLx, charge is accumulated in the capacitor 36 through the transistor 35 which is in the on state. In addition, the potential of the image signal is applied to the pixel electrode of the liquid crystal element 34 through the transistor 35 which is in the on state.

In the timing chart illustrated in FIG. 6, an example in which an image signal corresponding to the image data (DataA) is written to the pixel (Pix1-1) in the first frame period (F1) is shown.

The transmittance of the liquid crystal element 34 changes when the alignment of liquid crystal molecules changes in accordance with the level of the voltage applied between the pixel electrode and the common electrode. Accordingly, when the transmittance of the liquid crystal element 34 is controlled by the potential of an image signal, gray-scale images can be displayed.

When the input of image signals to the wirings SL1 to SLx is completed, the wiring GL1 is deselected. When the wiring GL1 is deselected, the transistors 35 in the pixels 33 including the wiring GL1 are turned off. Then, the voltage applied between the pixel electrode and the common electrode is held in the liquid crystal element 34, so that the display of gray-scale images is maintained.

Similarly, the wirings GL2 to GLy are sequentially selected, and the pixels 33 connected to the wirings GL2 to GLy are sequentially subjected to the same operation as that performed while the wiring GL1 is selected. Through the above operations, one image is displayed on the pixel portion 30. The above display of the image is maintained until the first frame period (F1) ends.

Note that the wirings GL may be selected by progressive scan which is sequentially performed from the wiring GL1 to the wiring GLy as described above or methods other than progressive scan, such as interlace scan.

Then, in response to the next pulse of the vertical synchronization signal (Vsync), the first frame period (F1) is ended and the second frame period (F2) is started. From the second frame period (F2) to the (t−3)-th frame period (Ft−3), an image signal is written to the pixel portion 30 as in the first frame period (F1). Note that image data corresponding to the image signal written to the pixel portion 30 from the second frame period (F2) to the (t−3)-th frame period (Ft−3) is not necessarily the same as the image data corresponding to the image signal written to the pixel portion 30 in the first frame period (F1).

Next, the operation of the pixel portion 30 from the (t−2)-th frame period (Ft−2) to the t-th frame period (Ft) will be described. FIG. 6 illustrates a case where the display device 16 stops the update of display of the image in response to the signal (Sige) from the (t−2)-th frame period (Ft−2) to the t-th frame period (Ft).

Specifically, the (t−2)-th frame period (Ft−2) is started in response to a pulse of the vertical synchronization signal (Vsync), and then an image signal is written to the pixel portion 30 in FIG. 6 as in the first frame period (F1). In the timing chart illustrated in FIG. 6, an example in which an image signal corresponding to the image data (DataB) is written to the pixel (Pix1-1) in the (t−2)-th frame period (Ft−2). The operations of the driver circuits 31 and 32 are stopped during the time from when one image is displayed on the pixel portion 30 by the image signal written to the pixel portion 30 to when the subsequent frame period, the (t−1)-th frame period (Ft−1), is started, so that the above display of the image is maintained until the (t−2)-th frame period (Ft−2) is ended.

The operations of the driver circuits 31 and 32 are stopped when the controller 37 stops a function of generating a control signal such as a clock signal or a start pulse signal in response to the signal (Sige). In addition, the controller 37 stops the function of generating an image signal (Vsig) when the controller 37 stops the operations of the driver circuits 31 and 32. FIG. 6 illustrates a case where the controller 37 stops a function of generating a control signal such as a clock signal or a start pulse signal in response to the potential of the signal (Sige) changed from a low level to a high level, and stops the function of generating an image signal (Vsig).

Specifically, when a potential at which the operation of the driver circuits 31 or the driver circuit 32 is stopped is applied to a wiring for applying the control signal to the driver circuits 31 or the driver circuit 32 or when the wiring is made to be in an electrically floating state, applying of the control signal to the driver circuits 31 or the driver circuit 32 can be stopped.

When the operation of the driver circuits 31 is stopped, the driver circuits 31 stop selecting the wirings GL. When the operation of the driver circuit 32 is stopped, the input of image signals to the wirings SL by the driver circuit 32 is stopped. Through the above operations, display of the image on the pixel portion 30 is maintained.

Specifically, FIG. 6 illustrates a case where, in the (t−2)-th frame period (Ft−2), the operations of the driver circuits 31 and 32 are stopped after the end of writing of image signals to the pixel portion 30, and display of the image on the pixel portion 30 is maintained. Through the above operations, the (t−2)-th frame period (Ft−2) can be longer than each of the first frame period (F1) to the (t−3)-th frame period (Ft−3). Specifically, in FIG. 6, the length of a cycle in which pulses of the vertical synchronization signal (Vsync) appear is substantially the same as the length of each of the first frame period (F1) to the (t−3)-th frame period (Ft−3); however, the length of the (t−2)-th frame period (Ft−2) is longer than the above cycle.

Note that there is a limitation on a period during which the pixel 33 can maintain the display of gray-scale images. In addition, the liquid crystal layer deteriorates if an electric field in the same direction is continuously applied to the liquid crystal element 34; therefore, it is required, in a given period, to reverse the direction in which the electric field is applied to the liquid crystal element 34. Accordingly, in consideration of the period during which the pixel 33 can maintain the display of gray-scale images, the period until the liquid crystal layer deteriorates, or the like, the maximum length of the frame period in a period during which no instruction is input for rewriting an image signal (Vsig) is set in advance. For example, in the case where a period during which a still image is displayed is longer than the maximum length of the frame period, the controller 37 may have a function of forcefully terminating the frame period even when there is no instruction for rewriting an image signal. Then, the same image signal is rewritten to the pixel portion 30 in the subsequent frame period, and the image displayed in the previous frame period is displayed again on the pixel portion 30.

Figure 26:
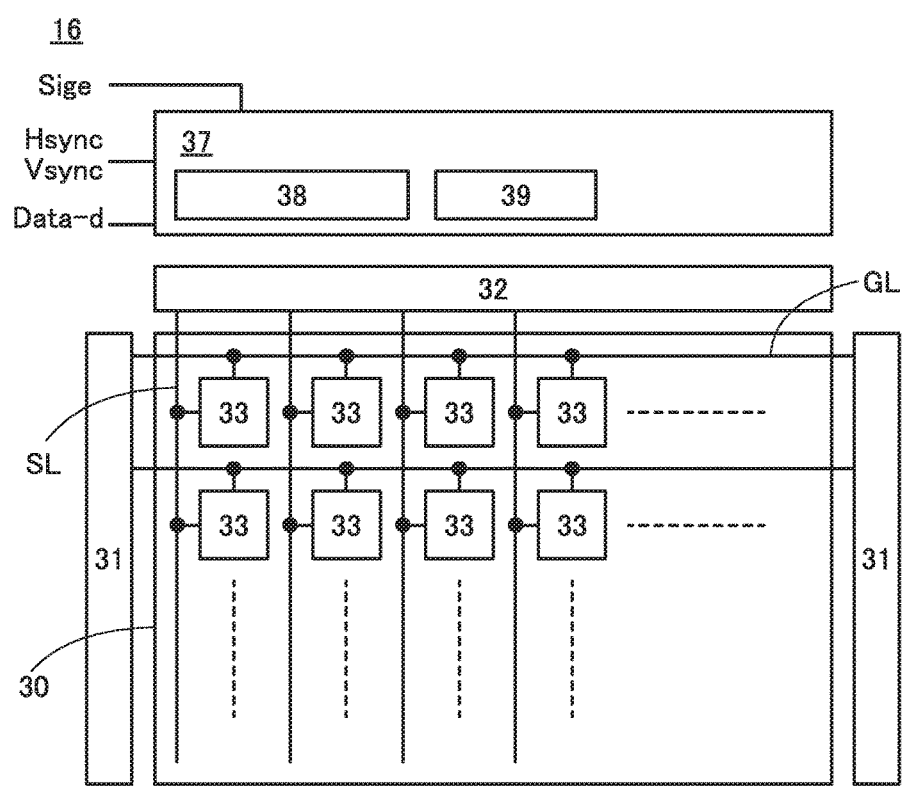
FIG. 26 illustrates a structure of a display device.

FIG. 26 illustrates a structure example of the display device 16 of one embodiment of the present invention. The display device 16 illustrated in FIG. 26 further includes a counter 39 in the controller 37 of the display device 16 illustrated in FIG. 5A. The counter 39 has a function of starting counting in response to one pulse of pulses included in the Vsync signal and determining the length of the frame period. The controller 37 has a function of controlling the operations of the driver circuits 31 and the driver circuit 32 to rewrite the image signal in the pixel portion 30 regardless of the signal (Sige) when the frame period determined by the counter 39 is ended.

Alternatively, the frame period may be forcefully terminated in response to the instruction for rewriting an image signal from an input device or the like.

Note that display of the image may be performed again using the decoded image data (Data-d) in the frame memory 23 when display of the image is performed, in the display device 16, using the same image signal (Vsig) as in the previous frame period.

FIG. 6 shows an example where the image signal corresponding to the image data (DataB) is written in the pixel (Pix1-1) in response to pulses of the vertical synchronization signal (Vsync) also in the t−1-th frame period (Ft−1) which is started after the t−2-th frame period (Ft−2) and in the t-the frame period (Ft) which is started after the t−1-th frame period (Ft−1) as in the t−2-th frame period (Ft−2). Specifically, FIG. 6 illustrates a case where the controller 37 performs again the function of generating the image signal (Vsig) and performs again the function of generating the control signal in response to the potential of the signal (Sige) changed from a high level to a low level at the time when the periods start in the t−1-th frame period (Ft−1) and in the t-th frame period (Ft). Then, the controller 37 stops performing a function of generating the image signal (Vsig) and stops performing a function of generating the control signal in response to the potential of the signal (Sige) changed from a low level to a high level after the rewriting of the image signal (Vsig) to the pixel portion 30 is ended.

In one embodiment of the present invention, when the driver circuit 31 and the driver circuit 32 are operated intermittently, the number of times of writing image signals to the pixel portion 30 can be greatly reduced while the image is continuously displayed on the display portion 30. For example, in the case where a transistor including a highly purified oxide semiconductor for a channel formation region as the transistor 35 in the pixel 33, the length of a frame period can be made longer than or equal to 10 seconds, preferably longer than or equal to 30 seconds, and further preferably longer than or equal to one minute. Accordingly, the drive frequency of the driver circuit 31 and the driver circuit 32 can be significantly reduced, leading to a reduction in the power consumption of the display device 16.

Note that in one embodiment of the present invention, it is possible to employ dot sequential driving in which image signals are sequentially input from the driver circuit 32 to the wirings SL1 to SLx, or line sequential driving in which image signals are concurrently input from the driver circuit 32 to the wirings SL1 to SLx. Alternatively, the semiconductor device of one embodiment of the present invention may employ a driving method in which image signals are sequentially input to every plural wirings SL.

Furthermore, the response time of liquid crystal from application of voltage to saturation of the change in transmittance is generally about ten milliseconds. Thus, the slow response of the liquid crystal tends to be perceived as a blur of a moving image. As a countermeasure, one embodiment of the present invention may employ overdriving in which voltage applied to the liquid crystal element 34 is temporarily increased so that alignment of the liquid crystal is changed quickly. By overdriving, the response speed of the liquid crystal can be increased, a blur of a moving image can be prevented, and the quality of the moving image can be improved.

Furthermore, if the transmittance of the liquid crystal element 34 keeps changing without being saturated after the transistor 35 is turned off, the relative dielectric constant of the liquid crystal also changes; accordingly, the voltage held in the liquid crystal element 34 easily changes. In particular, in the case where the capacitor 36 connected to the liquid crystal element 34 has small capacitance, the change in the voltage held in the liquid crystal element 34 tends to occur considerably. However, by the overdriving, the response time can be shortened and therefore the change in the transmittance of the liquid crystal element 34 after the transistor 35 is turned off can be made small. Hence, even in the case where the capacitor 36 connected in parallel to the liquid crystal element 34 has small capacitance, it is possible to prevent the change in the voltage held in the liquid crystal element 34 after the transistor 35 is turned off.

This embodiment can be combined with any of the other embodiments as appropriate.

Embodiment 3

In this embodiment, specific structure examples of the transmission system and the semiconductor device of one embodiment of the present invention will be described giving an example of a data transmission system in accordance with ITU-T H.265 (ISO/IEC 23008-2 HEVC), which is one of standards for video compression. Hereinafter, ITU-T H.265 (ISO/IEC 23008-2 HEVC) is called H.265/HEVC.

Figure 7:
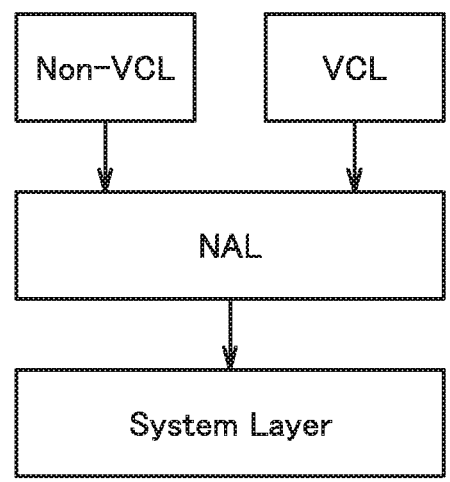
FIG. 7 illustrates a hierarchical structure of data.

FIG. 7 illustrates a hierarchical structure of data compressed according to H.265/HEVC. In H.265/HEVC, a layer in which encoded core image data is dealt with is called a video coding layer (VCL). VCL data is contained in a layer which is called a network abstraction layer (NAL) whose object is to transmit image data. Non-VCL data which accompanies VCL data and includes information other than the image data is also contained in the NAL. Furthermore, data in the NAL is transmitted by multiplexing of information such as video, audio, or the like in a system layer.

Figure 8:
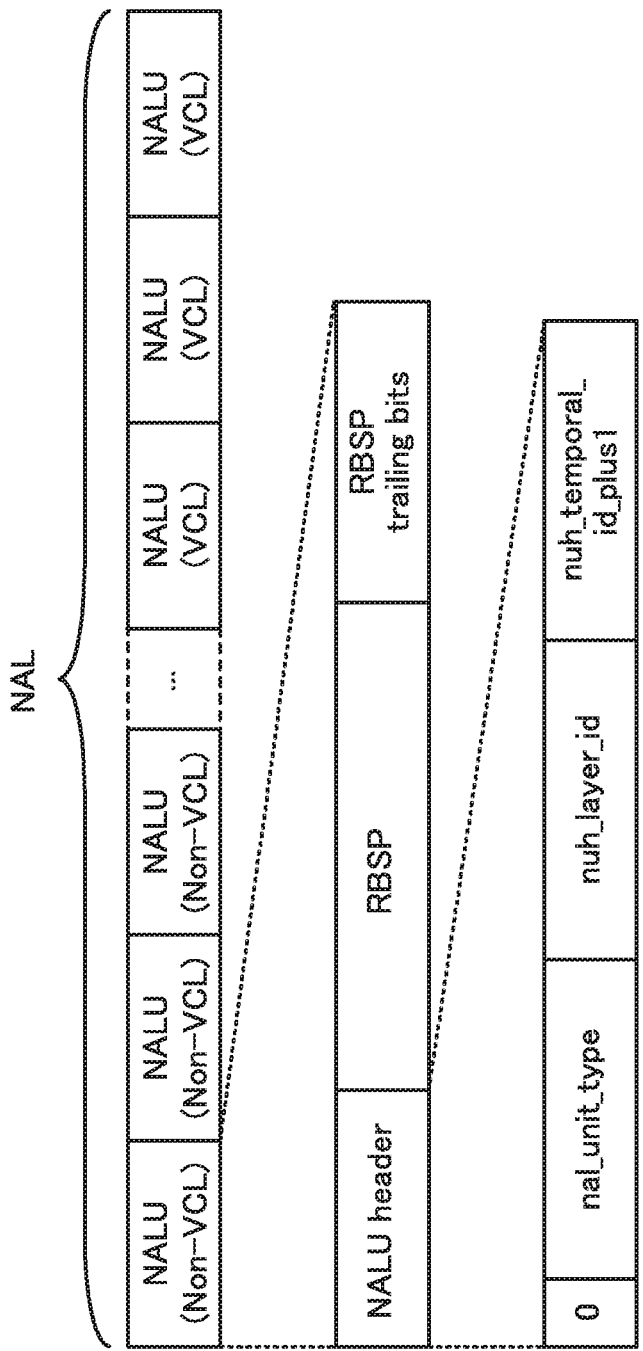
FIG. 8 illustrates a structure of a NAL.

FIG. 8 illustrates a basic structure of data in a NAL. NAL data consists of NAL units (NALU), which are the minimum units of a NAL. A NALU is classified into a NALU (Non-VCL) including Non-VCL data and a NALU (VCL) including VCL data.

In actual data transmission, a NALU (Non-VCL) is transmitted first, and in the NALU (Non-VCL), data properties of the subsequent NALU (VCL) are defined. The NALU (VCL) includes image data corresponding to the data properties defined in the corresponding NALU (Non-VCL).

A NALU includes a NALU header, a raw byte sequence payload (RBSP), and RBSP trailing bits. The NALU header includes information on the subsequent RBSP, such as an identifier indicating kinds of the NALUs (nal_unit_type) and a nuh_layer_id and a nuh_temporal_id_plus1 that are used for scalability. The RBSP of the NALU (Non-VCL) contains Non-VCL data, and the RBSP of the NALU (VCL) contains VCL data.

The nal_unit_type is formed using 6-bit data, in which it is defined how VCL data or how Non-VCL data the subsequent RBSP is.

In H.265/HEVC, the nal_unit_type is provided with a frame for expansion or an undefined frame. In one embodiment of the present invention, comparison data on whether the image data contained in the RBSP is identical with the reference image data or not is added to the NALU using the undefined frame. That is, at the time of encoding in the encoder 12, in the case where the reference image data and the image data contained in the RBSP are exactly identical with each other, the undefined frame can be used as a NALU header, especially as a nal_unit_type, indicating such a state. Specifically, since the nal_unit_types of 48 to 63 are undefined frames in H.265/HEVC, it can be defined that pieces of the data are identical when they are compared to each other, that is, the reference data and the image data contained in the RBSP are identical with each other, when the nal_unit_type is 62, for example. Note that an undefined frame used when the comparison data on whether the reference image data and the image data contained in the RBSP are identical with each other or not is added to the NALU may be other than 62.

When one-frame image data is transmitted from the transmitter 10 to the semiconductor device 11, a NALU (Non-VCL) is transmitted first and then a NALU (VCL) is transmitted. Therefore, the decoder 14 included in the semiconductor device 11 performs a decoding processing for the subsequent NALU (VCL) data using a data format that is defined in the NALU (Non-VCL) which is received first.

Note that the nal_unit_type may be 62 in all of the NALUs that do not require encoding or the nal_unit_type may be 62 only in the forefront NALU (Non-VCL) which is transmitted first of a plurality of NALUs belonging to a certain group.

For example, when the first-frame image data is exactly identical with the second-frame image data which is transmitted after the first frame, the nal_unit_type in the forefront NALU (Non-VCL) is made to be 62 at the time of transmitting the second-frame image data, so that decoding processing of all of the NALUs corresponding to the second-frame image data, including the forefront NALU (Non-VCL), can be omitted in the decoder 14.

For further example, when the first-frame image data is identical with the second-frame image data which is transmitted after the first-frame image data in pixels in a certain area, the nal_unit_type in the forefront NALU (Non-VCL) of a plurality of the NALUs containing image data corresponding to the pixels in the above area is made to be 62. The Non-VCL data contained in the RBSP following the NALU header in the forefront NALU (Non-VCL) includes information on the plurality of the NALUs containing image data corresponding to the pixels in the above certain area. In the decoder 14, the Non-VCL data is decoded to specify the above plurality of NALUs, so that a decoding processing of the plurality of NALUs can be omitted.

Figure 9:
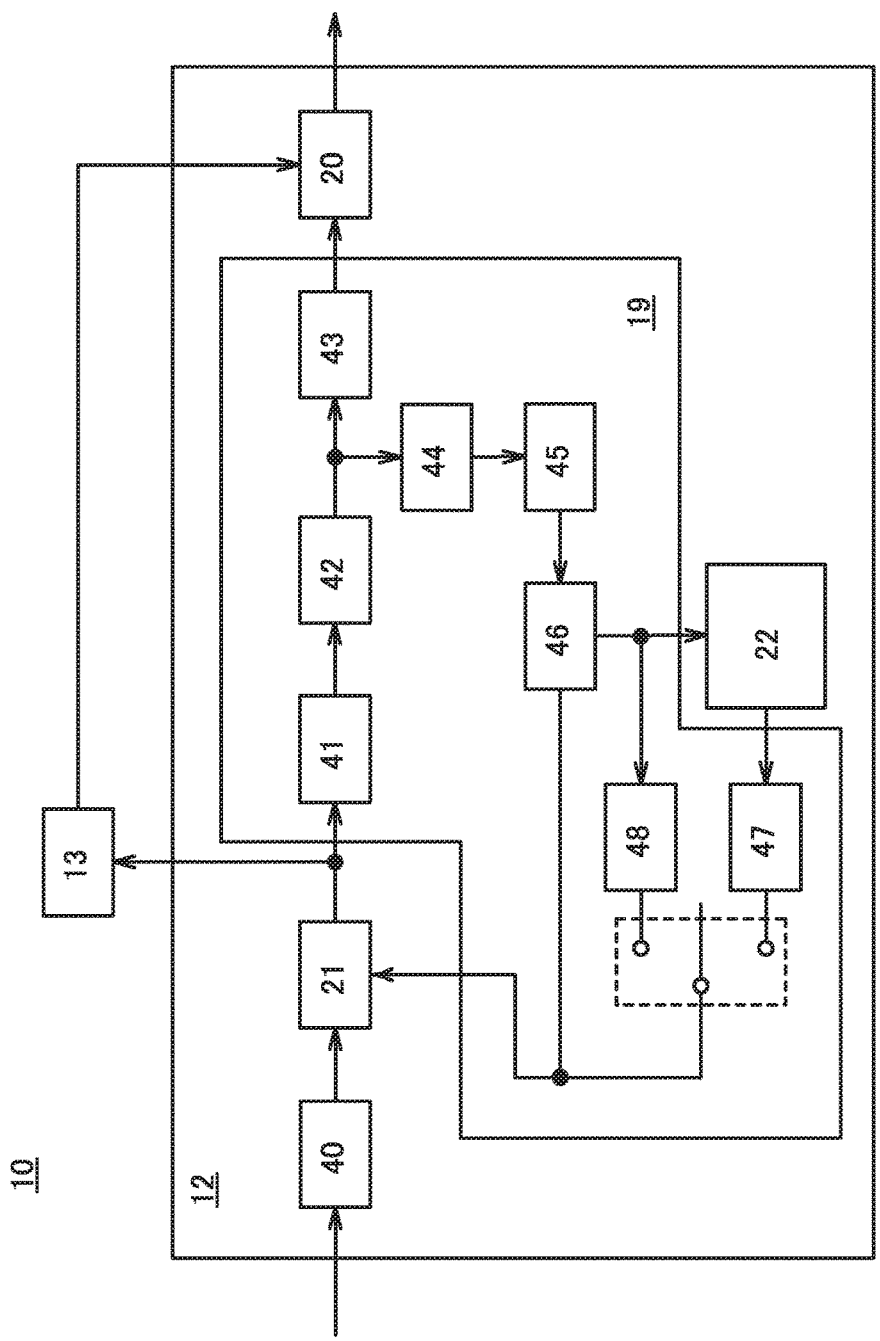
FIG. 9 illustrates one embodiment of a transmitter.

FIG. 9 illustrates a structure example of the transmitter 10 for H.265/HEVC of one embodiment of the present invention. The transmitter 10 illustrated in FIG. 9 includes the encoder 12 and the difference determination circuit 13. The encoder 12 includes the frame memory 22, the subtraction circuit 21, the signal processing circuit 19, the header adding circuit 20, and a block dividing circuit 40. The signal processing circuit 19 includes a discrete cosine transform (DCT) circuit 41, a quantization circuit 42, an entropy coding circuit 43, an inverse quantization circuit 44, an inverse discrete cosine transform (iDCT) circuit 45, an addition circuit 46, an interframe prediction circuit 47, and an intraframe prediction circuit 48.

The block dividing circuit 40 has a function of dividing one-frame image data into some pieces of image data corresponding to areas corresponding to a plurality of pixels. The divided pieces of image data are each called a CTU (coding tree unit). In the transmitter 10 illustrated in FIG. 9, the subtraction circuit 21 has a function of comparing a CTU of image data before encoding and a CTU of the reference image data. Plural pieces of the CTU image data are contained in one NALU (VCL).

The DCT circuit 41 has a function of performing discrete cosine transform on the image data. The quantization circuit 42 has a function of performing a quantization processing on the CTU subjected to discrete cosine transform. The entropy coding circuit 43 has a function of performing an entropy coding processing on the CTU subjected to the quantization processing. The CTU subjected to the entropy coding processing is integrated into one NALU in the header adding circuit 20. The NALU formed by the combination is given comparison data in the header adding circuit 20.

The inverse quantization circuit 44 has a function of performing an inverse quantization processing on the CTU subjected to the quantization processing. The iDCT circuit 45 has a function of performing inverse discrete cosine transform on the CTU subjected to the inverse quantization processing. The addition circuit 46 has a function of combining information on difference calculated in the intraframe prediction circuit 48 or information on difference calculated in the interframe prediction circuit 47 with the CTU subjected to the inverse discrete cosine transform, and generating a CTU of the reference image data. The frame memory 22 has a function of storing the above CTU of the reference image data.

The intraframe prediction circuit 48 has a function of calculating difference between a value predicted from the adjacent CTU and a value of a CTU actually input in one frame. The interframe prediction circuit 47 has a function of calculating difference between a value predicted from the already transmitted CTU and an actual CTU value which corresponds to a pixel in the same area as that of the CTU, between frames.

Figure 10:
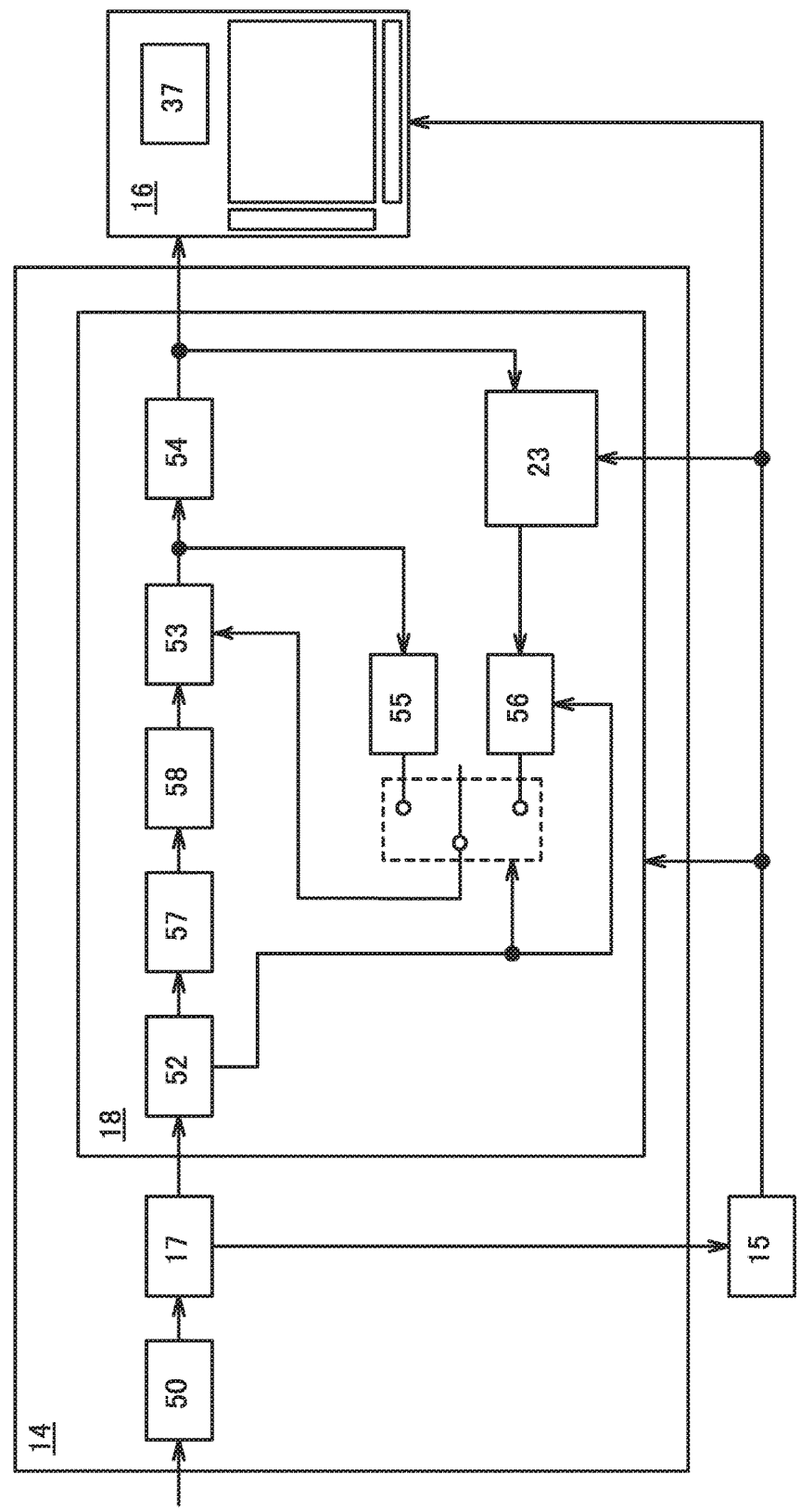
FIG. 10 illustrates one embodiment of a semiconductor device.

Next, FIG. 10 illustrates a structure example of the semiconductor device 11 for H.265/HEVC of one embodiment of the present invention. The semiconductor device 11 illustrated in FIG. 10 includes the decoder 14, the signal generation circuit 15, and the display device 16. The decoder 14 includes a system-layer header analysis circuit 50, the analysis circuit 17, and the arithmetic circuit 18. The arithmetic circuit 18 includes an entropy decoding circuit 52, an addition circuit 53, an in-loop filter 54, an intraframe prediction circuit 55, an interframe prediction circuit 56, an inverse quantization circuit 57, an iDCT circuit 58, and a frame memory 23.

The system-layer header analysis circuit 50 has a function of analyzing a header of a system layer. A header of the system layer is analyzed, whereby the kind of data contained in the NAL of the received CTU specifically image data or audio data is specified. The analysis circuit 17 has a function of analyzing the NALU header of the NALU contained in the NAL. The NALU header is analyzed, whereby properties of the RBSP contained in the NALU are determined. The arithmetic circuit 18 has a function of performing decoding based on the properties of the RBSP by arithmetic processing.

When a nal_unit_type contained in a NALU header is determined to be 62 in the analysis circuit 17, the analysis circuit 17 determines not to decode the CTU. In this case, the signal generation circuit 15 can generate a signal (Sige) including an instruction not to decode the RBSP following the NALU header in response to the above determination of the analysis circuit 17. When a nal_unit_type contained in a NALU header is determined not to be 62 in the analysis circuit 17, the analysis circuit 17 makes a determination to decode the CTU. In this case, the signal generation circuit 15 can generate a signal (Sige) including an instruction to decode the RBSP following the NALU header in response to the above determination of the analysis circuit 17. The arithmetic circuit 18 has a function of performing decoding in response to the signal (Sige).

The display device 16 has a function of updating image display using the image data in response to the signal (Sige). Specifically, the display device 16 has a function of displaying an image using the image data included in the decoded RBSP in response to the signal (Sige) when the RBSP following the NALU header is decoded in the arithmetic circuit 18. In addition, the display device 16 has a function of maintaining the image already displayed on the display device 16 in response to the signal (Sige) when the RBSP following the NALU header is not decoded in the arithmetic circuit 18.

The entropy decoding circuit 52 has a function of performing an entropy decoding processing on the CTU. The quantization circuit 57 has a function of performing an inverse quantization processing on the CTU subjected to the entropy decoding processing. The iDCT circuit 58 has a function of performing inverse discrete cosine transform on the CTU subjected to the inverse quantization processing. The addition circuit 53 has a function of combining information on difference calculated in the intraframe prediction circuit 55 or information on difference calculated in the interframe prediction circuit 56 with the CTU subjected to the inverse discrete cosine transform. The intraframe prediction circuit 55 has a function of calculating difference between a value predicted from the adjacent CTU and a value of a CTU actually input in one frame. The interframe prediction circuit 56 has a function of calculating difference a value predicted from the already transmitted CTU and an actual CTU value which corresponds to a pixel in the same area as that of the CTU between frames.

The in-loop filter 54 has a function of reducing noise of the CTU generated in the addition circuit 53. The frame memory 23 has a function of storing the CTU whose noise has been reduced in the in-loop filter 54.

The decoded CTU which has been output from the decoder 14 is transmitted to the display device 16. The display device 16 includes a frame memory which has a function of storing the decoded CTU, and the CTU is reconstructed as one-frame image data in the frame memory. The controller 37 included in the display device 16 has a function of generating an image signal (Vsig) from the one-frame image data. Note that the frame memory included in the display device 16 can be regarded as part of the controller 37 or as a circuit other than the controller 37.

In one embodiment of the present invention, the above structure can reduce power consumption of the arithmetic circuit 18 which performs decoding, power consumption for writing and reading image data in the frame memory 23, power consumption for writing and reading image data in the frame memory in the display device 16, and power consumption for updating image display in the display device 16.

Next, a case will be described in which, when parts of the image to be displayed have no change between frames in part of the pixel portion included in the display device, image data is not rewritten only in a memory region of the frame memory which stores image data corresponding to the above area.

When part of the second-frame image data is identical with part of the first-frame image data, which is transmitted after the second-frame image data, an undefined frame can be used for a NALU included in the part of the image data as a NALU header indicating that the image data is identical. For example, when there is partly the same image data between the frames, a nal_unit_type in the NALU header may be 63. Note that the undefined used for adding comparison data on whether part of the second-frame image data is identical with the first-frame image data, which is transmitted after the second-frame image data may be other than 63.

The RBSP following the NALU header includes Non-VCL data. The Non-VCL data includes detailed information that the image data in one frame is partly the same as that in another or other frames. Specifically, information that the above transmitted frame (the second frame) image data and image data included in the CTU having a certain address are identical with each other is included, for example.

Figure 14A:
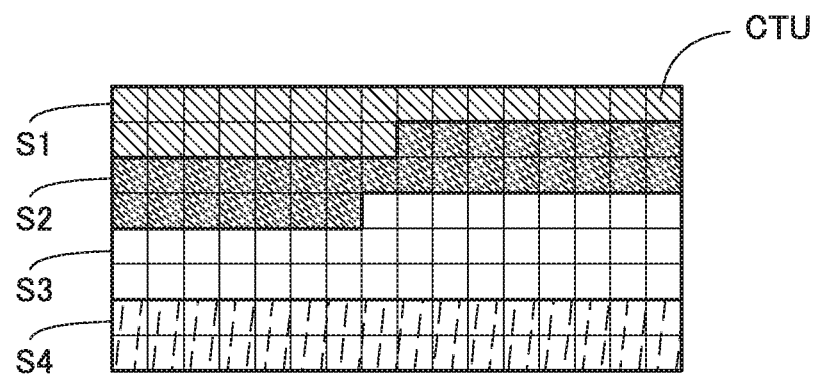
FIGS. 14A and 14B each schematically illustrate a method of dividing one-frame image.

Next, an example of a method of dividing image data will be described. In FIG. 14A, a method of dividing one-frame image is schematically illustrated. One of methods of dividing image data of H.265/HEVC is slice-dividing. One-frame image data consists of a plurality of slices and each slice consists of a plurality of CTUs arranged in a scan line direction. Specifically, in FIG. 14A, an example in which one-fame image data consists of four slices, i.e., a slice S1, a slice S2, a slice S3, and a slice S4, is schematically illustrated.

The CTU corresponds to image data of 8×8 pixels to 64×64 pixels. FIG. 14A illustrates an example in which one-fame image data consists of CTUs of 8×16 pixels. In addition, FIG. 14A illustrates an example in which the slice S1 consists of 24 CTUs, the slice S2 consists of 31 CTUs, the slice S3 consists of 41 CTUs, and the slice S4 consists of 32 CTUs. The image data of the CTUs contained in one slice is contained in one NALU (VCL).

Note that when the number of the CTUs contained in one slice is large, image data of the CTUs contained in one slice may be made to be contained in a plurality of NALUs (VCL).

Figure 14B:
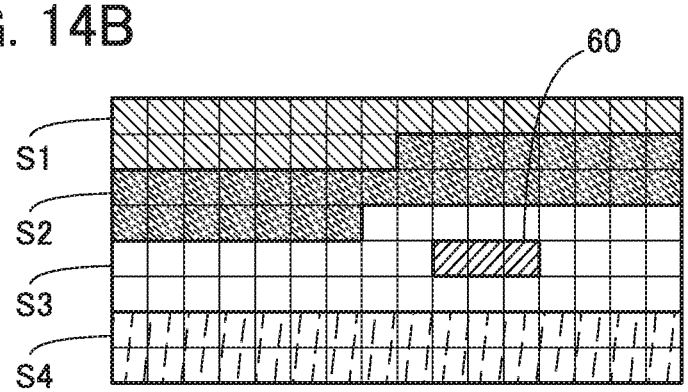

On the assumption that part of the CTU image data contained in the slice S3 among the one-frame image data illustrated in FIG. 14A has a difference between the frames and that all of the CTU image data in the other slices have no alternation between the frames, FIG. 14B schematically illustrates a state in which three pieces of CTU image data 60 among the one-frame image data illustrated in FIG. 14A are contained in the slice S3 which have an alternation between the frames.

Assuming that the nal_unit_type of the NALU header in the forefront NALU (Non-VCL) among the NALUs corresponding to the one-frame image data is 63 when three pieces of the CTU image data 60 have an alternation between the frames, the RBSP following the NALU header in the NALU (Non-VCL) contains information on the slice having an alternation of the image data or information on the CTU having an alternation of the image data.

In FIG. 14B, the NALU (VCL) corresponding to the slice S3 contains the CTU image data 60, which has an alternation between the frames. The signal generation circuit 15 can generate a signal (Sige) including an instruction to decode the NALU (Non-VCL) and the NALU (VCL) corresponding to the slice S3 and no to decode the NALU (Non-VCL) and the NALU (VCL) corresponding to the other slices S1, S2, and S4 in response to the above determination of the analysis circuit 17.

The arithmetic circuit 18 decodes the NALU (Non-VCL) and the NALU (VCL) corresponding to the slice S3 and does not decode the NALU (Non-VCL) and the NALU (VCL) corresponding to the other slices S1, S2, and S4 in response to the signal (Sige). The signal (Sige) contains an address of the CTU image data 60 having an alternation between the frames. The frame memory 23 rewrites the CTU image data 60 having an alternation between the frames and does not rewrite the CTU image data having no alternation between the frames in response to the signal (Sige). The display device 16 writes the image signal to pixels corresponding to the CTU having an alternation between the frames and does not write image signal to pixels corresponding to the CTU image data having no alternation between the frames in response to the signal (Sige).

Figure 15:
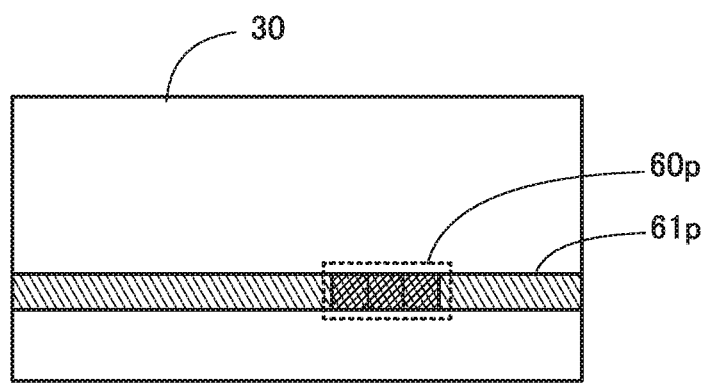
FIG. 15 schematically illustrates a relation between a pixel portion and a CTU.

Note that when image signals in pixels corresponding to three pieces of the CTU image data 60 among the one-frame image data are rewritten, image signals in pixels sharing the wiring GL with the pixels may be rewritten. FIG. 15 schematically illustrates an arrangement example of pixels 60p corresponding to three pieces of the CTU image data 60 and pixels 61p sharing a scan line with the pixels 60p in the pixel portion 30. The image signals in the pixels included in the area other than the pixels 61p need not be rewritten and the gray-scale images already displayed may be maintained.

Next, an example of specifying methods of an address of a pixel whose image data needs to be updated will be described.

Figure 16A:
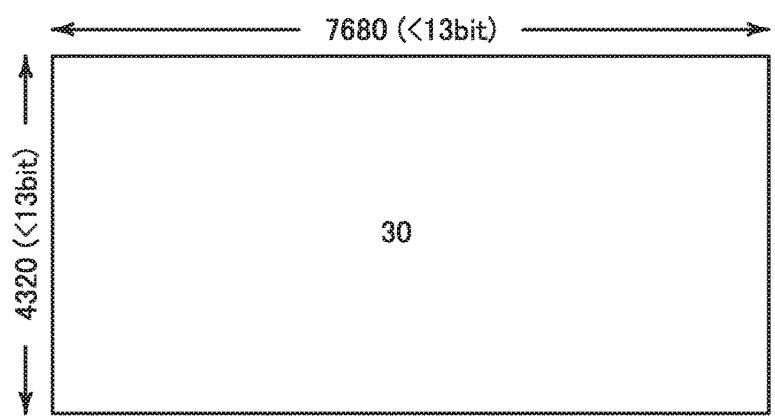
FIG. 16A illustrates a numerical relation between pixels in a vertical direction and pixels in a horizontal direction and FIG. 16B illustrates a relation between addresses of pixels in a vertical direction and addresses of pixels in a horizontal direction in a pixel portion.
Figure 16B:
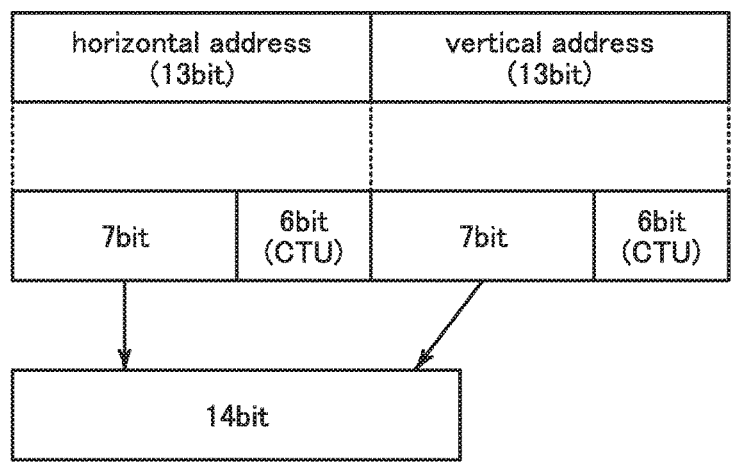

With an UHDTV as an example, FIG. 16A illustrates a numerical relation of pixels, in the pixel portion 30 included in the display device 16, in the vertical direction (a direction along the wirings SL) and in the horizontal direction (a direction along the wirings GL), and FIG. 16B schematically illustrates a relation between addresses of pixels in the vertical direction and addresses of pixels in the horizontal direction in the pixel portion 30.

The number of pixels in the horizontal direction is 7680 and pixel addresses in the horizontal direction can be expressed by 13 bits (8192 types). The number of pixels in the vertical direction is 4320 and pixel addresses in the vertical direction can be expressed by 13 bits (8192 types). Accordingly, all of the pixel addresses can be expressed by totally 26 bits consisting of 13 bits in the horizontal direction x 13 bits in the vertical direction.

Assuming that one CTU corresponds to 64 pixels (6 bits)×64 pixels, the respective 6 lower bits in the addresses in the vertical direction and in the horizontal direction show pixel addresses corresponding to one CTU. Therefore, if only the respective 7 upper bits in the addresses in the vertical direction and in the horizontal direction, totally 14 bits, can be determined, pixel addresses corresponding to a desired CTU can be specified.

Image signals in a row including pixels corresponding to the CTU having an alternation between the frames among the pixels included in the pixel portion 30 need to be subjected to batch rewriting. Therefore, information on the row requiring rewriting of the image signals can be expressed by the 7 bits of the addresses in the vertical direction.

When a memory array included in the frame memory is divided into a plurality of memory banks, the number of bits of the address of the memory cell may be increased in accordance with the number of divided memory banks. For example, when the memory array included in the frame memory is divided into 8 in the horizontal direction (a direction along a word line), 3 bits may be further added in order to specify addresses of the memory array divided into 8.

Figure 27:
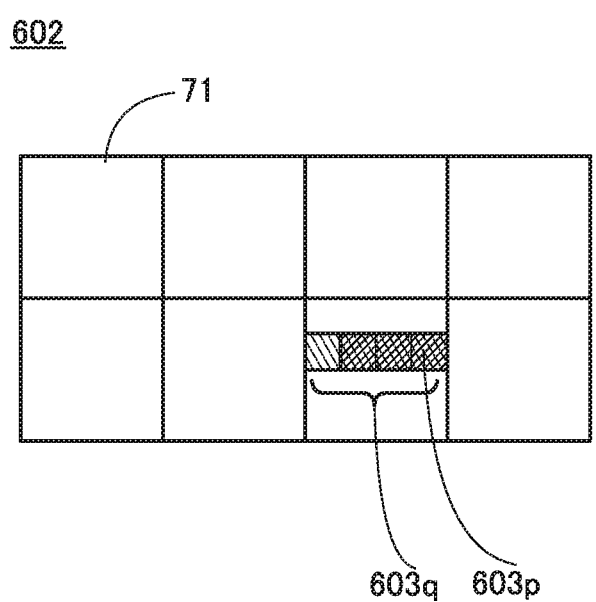
FIG. 27 schematically illustrates a relation between a memory array and a CTU.

When a memory array 602 included in the frame memory includes 8 memory banks 71, image data of the display device can be divided into 8 and stored in the frame memory. FIG. 27 schematically illustrates an arrangement example of a memory cell group 603p corresponding to three pieces of the CTU image data and a memory cell group 603q sharing a wiring WL with the memory cell group 603p in the memory array 602 in the frame memory. The frame memory can reduce the amount of image data which requires rewriting as compared to the display device 16 because its control is divided for each of the memory banks 71.

This embodiment can be combined with any of the other embodiments as appropriate.

Embodiment 4

In this embodiment, a configuration example of a frame memory will be described.

Figure 11:
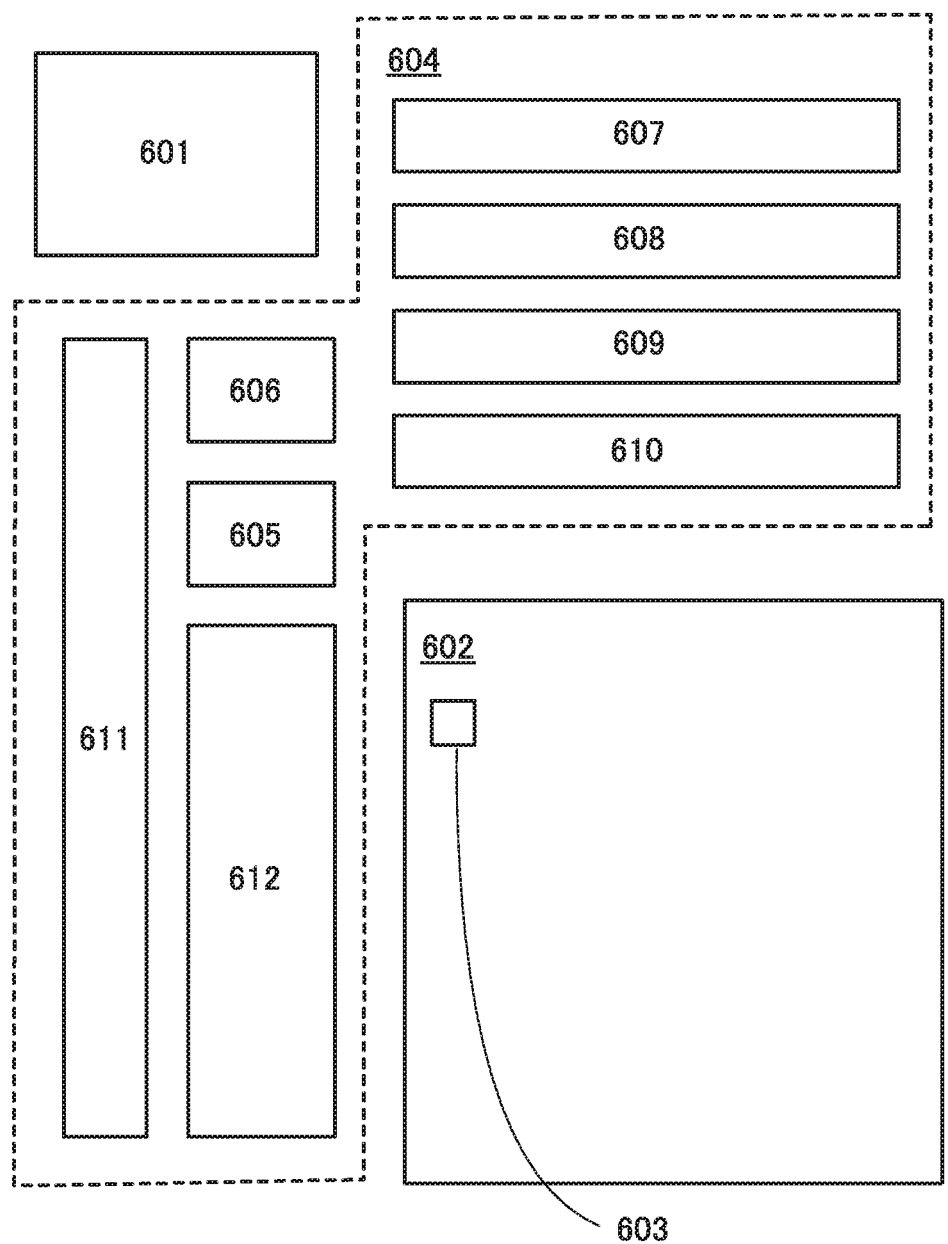
FIG. 11 is a block diagram illustrating a structure of a frame memory.

FIG. 11 is a block diagram showing a structure example of a frame memory. Note that, in the block diagram in FIG. 11, circuits in the frame memory are classified in accordance with their functions and separated blocks are illustrated. However, it is difficult to classify actual circuits according to their functions completely and it is possible for one circuit to have a plurality of functions.

The frame memory 600 illustrated in FIG. 11 includes the memory array 602 including a plurality of memory cells 603, a driver circuit 604, and a controller 601. The driver circuit 604 includes an input-output buffer 605, a main amplifier 606, a column decoder 607, a switch circuit 608, a precharge circuit 609, a sense amplifier 610, a writing circuit 611, and a row decoder 612.

Figure 12:
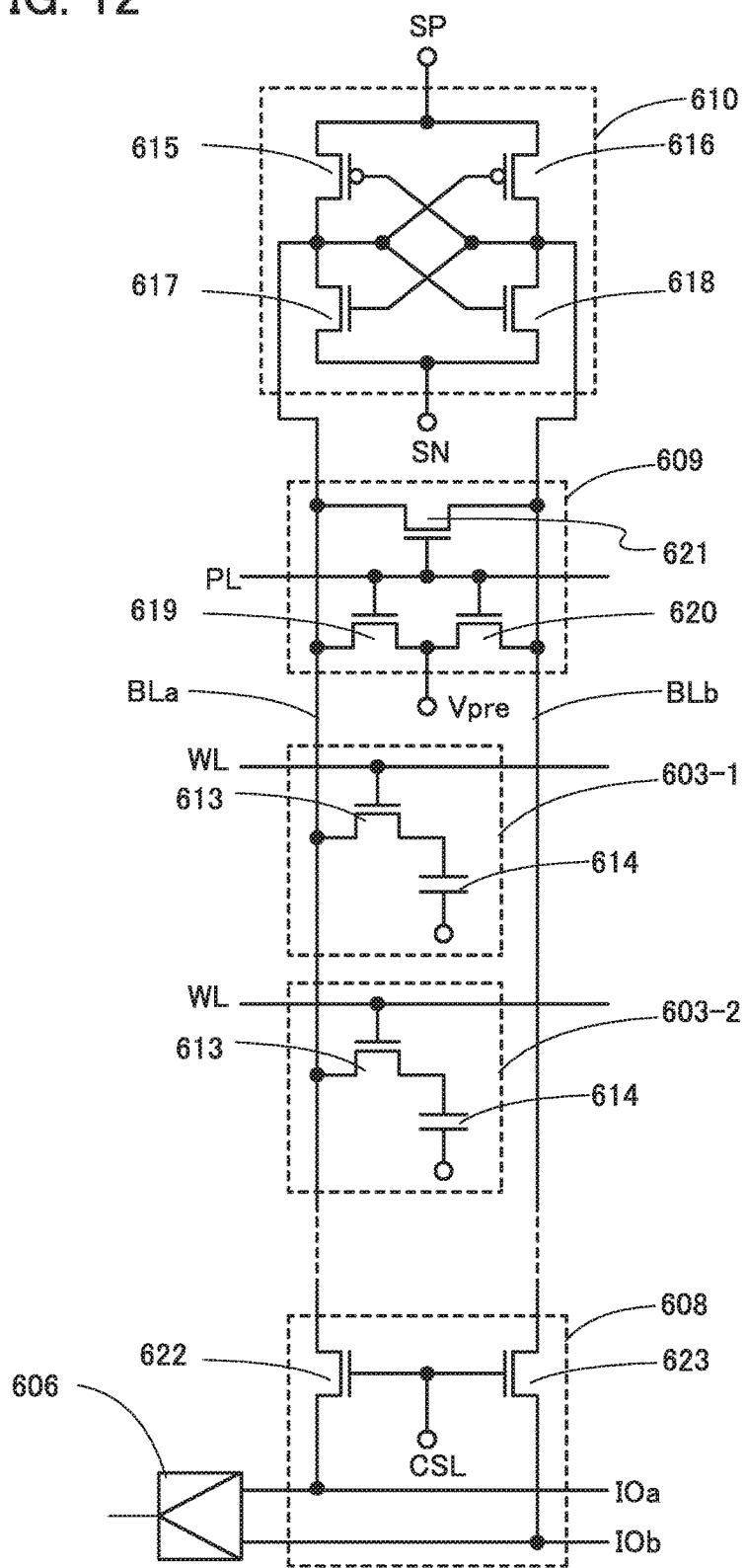
FIG. 12 illustrates a connection structure of memory cells, a sense amplifier, a precharge circuit, a switch circuit, and a main amplifier.

In addition, an example of a connection structure between the sense amplifier 610, the precharge circuit 609, the switch circuit 608, and the main amplifier 606 which are assigned to the memory cells 603 of one column is illustrated in FIG. 12. Note that FIG. 12 illustrates memory cells 603-1 and 603-2 belonging to one column.

Each of the memory cells 603-1 and 603-2 includes a transistor 613 functioning as a switch and a capacitor 614. The memory cells 603-1 and 603-2 are connected to a wiring BLa. The sense amplifier 610, the precharge circuit 609, and the switch circuit 608 are connected to the wiring BLa and a wiring BLb. The wirings BLa and BLb correspond to two respective wirings BL which are any two of a wiring BL1 to a wiring BLx. Note that all the memory cells 603 connected to the wirings BLa and BLb are connected to different wirings WL.

The input-output buffer 605 has a function of controlling input of a variety of signals and data to be written to the memory array 602 to the frame memory 600. The signal (Sige) generated in the signal generation circuit 15 is input to the controller 601 through the input-output buffer 605. The input-output buffer 605 has a function of controlling output of data, which is read out from the memory array 602, from the frame memory 600.

The controller 601 has a function of generating a variety of signals such as a start pulse signal or a clock signal controlling the driving of the column decoder 607 and a variety of signals such as a start pulse signal or a clock signal controlling the driving of the row decoder 612 using the signal input through the input-output buffer 605. In addition, the controller 601 has a function of generating signals controlling the driving of a variety of the circuits included in the driver circuit 604, such as the switch circuit 608, the precharge circuit 609, the sense amplifier 610, and the writing circuit 611, the power supply potentials, or the like.

The row decoder 612 has a function of controlling a potential applied to the wiring WL functioning as a word line to select the memory cells 603 in each row in response to a specified address. The column decoder 607 has a function of selecting the memory cells 603 in the column direction at the time of data writing or reading in response to a specified address by controlling the operation of the switch circuit 608.

The switch circuit 608 has a function of establishing connection between the wirings BL and the main amplifier 606 and connection between the wirings BL and the writing circuit 611. The writing circuit 611 has a function of writing data to the memory cell 603 at the specified address through the switch circuit 608.

The sense amplifier 610 has a function of amplifying a change in the potential of the wiring BL at the time of reading out data from the memory cell 603. Specifically, the sense amplifier 610 has a function of amplifying a potential difference between a reference potential and the potential of a data-containing signal output from the memory cell 603-1 or 603-2. In FIG. 12, it is possible to apply the potential of a data-containing signal to the wiring BLa and to apply the reference potential to the wiring BLb. Furthermore, the sense amplifier 610 has a function of temporarily storing the amplified potential difference.

The main amplifier 606 has a function of reading out data using the potential of the wiring BL amplified by the sense amplifier 610. The precharge circuit 609 has a function of resetting the potentials of the wirings BLa and BLb before the data reading.

Note that the frame memory 600 may include an address buffer that can temporarily store the address of the specified memory cell 603.

At the time of stopping writing of data to the frame memory 600 and reading out of data from the frame memory 600 in response to the signal (Sige), the controller 601 stops supplying signals, such as a clock signal or a start pulse signal, for controlling the driving of the row decoder 612 to the row decoder 612. At the time of starting again the writing of data to the frame memory 600 and the reading out of data from the frame memory 600 in response to the signal (Sige), the controller 601 restarts supplying signals, such as a clock signal or a start pulse signal, for controlling the driving of the row decoder 612 to the row decoder 612.

The conduction states of the transistors 613 in the memory cells 603-1 and 603-2 are controlled in response to the potentials of the wirings WL connected to gate electrodes of the transistors 613. In addition, the capacitor 614 is connected to the wiring BLa via the transistor 613.

Specifically, FIG. 12 illustrates the case where the sense amplifier 610 is a latch sense amplifier. The sense amplifier 610 includes p-channel transistors 615 and 616 and n-channel transistors 617 and 618. One of a source and a drain of the transistor 615 is connected to a wiring SP and the other is connected to gate electrodes of the transistors 616 and 618 and the wiring BLa. One of a source and a drain of the transistor 617 is connected to the gate electrodes of the transistors 616 and 618 and the wiring BLa and the other is connected to a wiring SN. One of a source and a drain of the transistor 616 is connected to a wiring SP and the other is connected to gate electrodes of the transistors 615 and 617 and the wiring BLb. One of a source and a drain of the transistor 618 is connected to the gate electrodes of the transistors 615 and 617 and the wiring BLb and the other is connected to the wiring SN.

The precharge circuit 609 includes n-channel transistors 619 to 621. The transistors 619 to 621 may be p-channel transistors. One of a source and a drain of the transistor 619 is connected to the wiring BLa and the other is connected to a wiring VPre. One of a source and a drain of the transistor 620 is connected to the wiring BLb and the other is connected to the wiring VPre. One of a source and a drain of the transistor 621 is connected to the wiring BLa and the other is connected to the wiring BLb. Gate electrodes of the transistors 619 to 621 are connected to a wiring PL.

The switch circuit 608 includes n-channel transistors 622 and 623. The transistors 622 and 623 may be p-channel transistors. One of a source and a drain of the transistor 622 is connected to the wiring BLa and the other is connected to a wiring IOa. One of a source and a drain of the transistor 623 is connected to the wiring BLb and the other is connected to a wiring IOb. Gate electrodes of the transistors 622 and 623 are connected to a wiring CSL. The potential of the wiring CSL is controlled by the column decoder 607.

The wirings IOa and IOb are connected to the main amplifier 606. The writing circuit 611 has a function of supplying potential to the wirings IOa and IOb in response to data.

Note that the sense amplifier 610 is not limited to the above latch sense amplifier, and may be a current-mirror sense amplifier or a single-end sense amplifier. In the case where the sense amplifier 610 is a single-end sense amplifier, the potential of the wiring BLb need not be reset; thus, the transistors 620 and 621 in the precharge circuit 609 can be omitted.

The combination of the wirings BLa and BLb can be determined as appropriate by an array structure. In one embodiment of the present invention, an array structure such as a folded bit line structure, a cross-point structure, or an open bit line structure can be used, and any two of the wirings BL1 to BLx may be connected to the main amplifier 606 through the switch circuit 608 in accordance with the array structures. Note that, as described above, all the memory cells 603 connected to the wiring BLa and the wiring BLb are connected to wirings WL different from each other.

Assuming that part of the CTU image data among the one-frame image data has a difference between the frames and that all the other CTU image data has no difference between the frames, only part of the CTU image data which has a difference may be rewritten in the frame memory. In the case where a first memory cell 603 which requires rewriting of image data and a second memory cell 603 which does not require rewriting of image data are connected to one wiring WL, when the transistor 613 in the first memory cell 603 is turned on in order to rewrite the data, the transistor 613 in the second memory cell 603 is also turned on. In this case, image data may be written again to the second memory cell 603 as written to the first memory cell 603, or data stored in the second memory cell 603 may be temporarily stored in the sense amplifier 610 and returned to the second memory cell 603 from the sense amplifier 610 when the transistor 613 included in the second memory cell 603 is turned on.

Note that the sense amplifier 610 and the memory cells 603 in the driver circuit 604 are stacked, so that the length of a variety of wirings electrically connecting the memory cells 603 and the sense amplifier 610, such as the wirings BLa, BLb, and the like, can be reduced. Therefore, the resistance of the wirings can be made small, so that reduction in power consumption and high-speed operation are achieved in the frame memory 600.

Note that a plurality of the memory arrays 602 may be stacked over the driver circuit 604 in the frame memory 600. The driver circuit 604 and the memory arrays 602 are stacked up, so that the length of a variety of wirings electrically connecting the driver circuit 604 and the memory arrays 602 can be reduced. Therefore, the wiring resistance can be made small, so that reduction in power consumption and high-speed operation are achieved in the frame memory 600. In addition, the driver circuit 604 and the memory arrays 602 are stacked up, so that both size reduction and high integration can be achieved in the frame memory 600.

Figure 25:
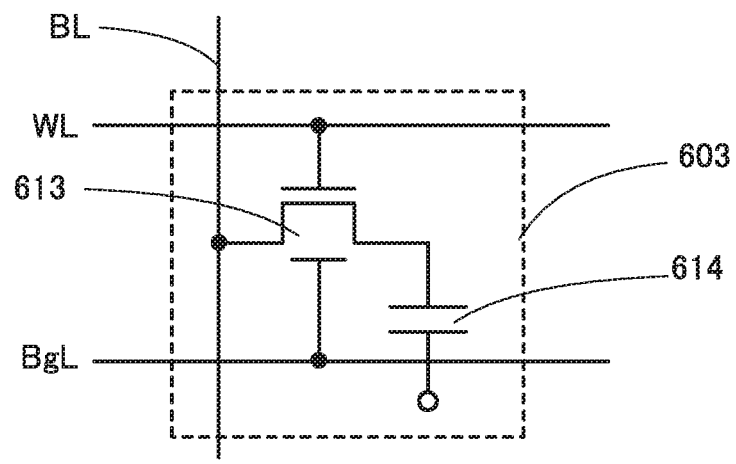
FIG. 25 illustrates a configuration of a memory cell.

Note that although each of the transistors 613 is provided with the gate electrode only on one side of the semiconductor film in the memory cells 603-1 and 603-2 illustrated in FIG. 12, each of the transistors 613 may include two gate electrodes and the semiconductor film may be sandwiched between the two gate electrodes. FIG. 25 illustrates an example of a circuit diagram of the memory cell 603. The memory cell 603 illustrated in FIG. 25 includes a transistor 613 and a capacitor 614. The transistor 613 illustrated in FIG. 25 includes a gate electrode connected to the wiring WL and a second electrode (a back gate electrode) connected to a wiring BgL.

A transistor used in the driver circuit 604, not only the transistor 613 used in the memory cell 603, may be provided with a back gate electrode.

A transistor including a back gate electrode can control its threshold voltage and shift value in accordance with the potential applied to the back gate electrode. Note that a shift value is the value of the gate voltage at a drain current of $10^{-12}$ A. Specifically, when the transistor is an n-channel transistor, for example, the potential applied to the back gate electrode is shifted in a positive direction, so that the threshold voltage can be shifted in a negative direction and the shift value can be increased. In addition, when the transistor is an n-channel transistor, for example, the potential applied to the back gate electrode is shifted in a negative direction, so that the threshold voltage can be shifted in a positive direction and the shift value can be decreased. When the transistor is a p-channel transistor, relations between the potential applied to the back gate electrode and the threshold voltage and between the potential applied to the back gate electrode and the shift value are reversed from those when the transistor is an n-channel transistor.

Accordingly, the threshold voltage is shifted in a negative direction and the shift value is increased by controlling the potential of the back gate electrode in the transistor included in the driver circuit, so that the on-state current of the transistor can be increased. Therefore, high-speed operation of the driver circuit can be achieved. In addition, for example, the threshold voltage is shifted in a positive direction and the shift value is decreased by controlling the potential of the back gate electrode in the transistor 613 used in the memory cell 603, so that the cutoff current of the transistor can be decreased. Therefore, long data-retention time of the memory cell 603 can be secured.

Figure 13:
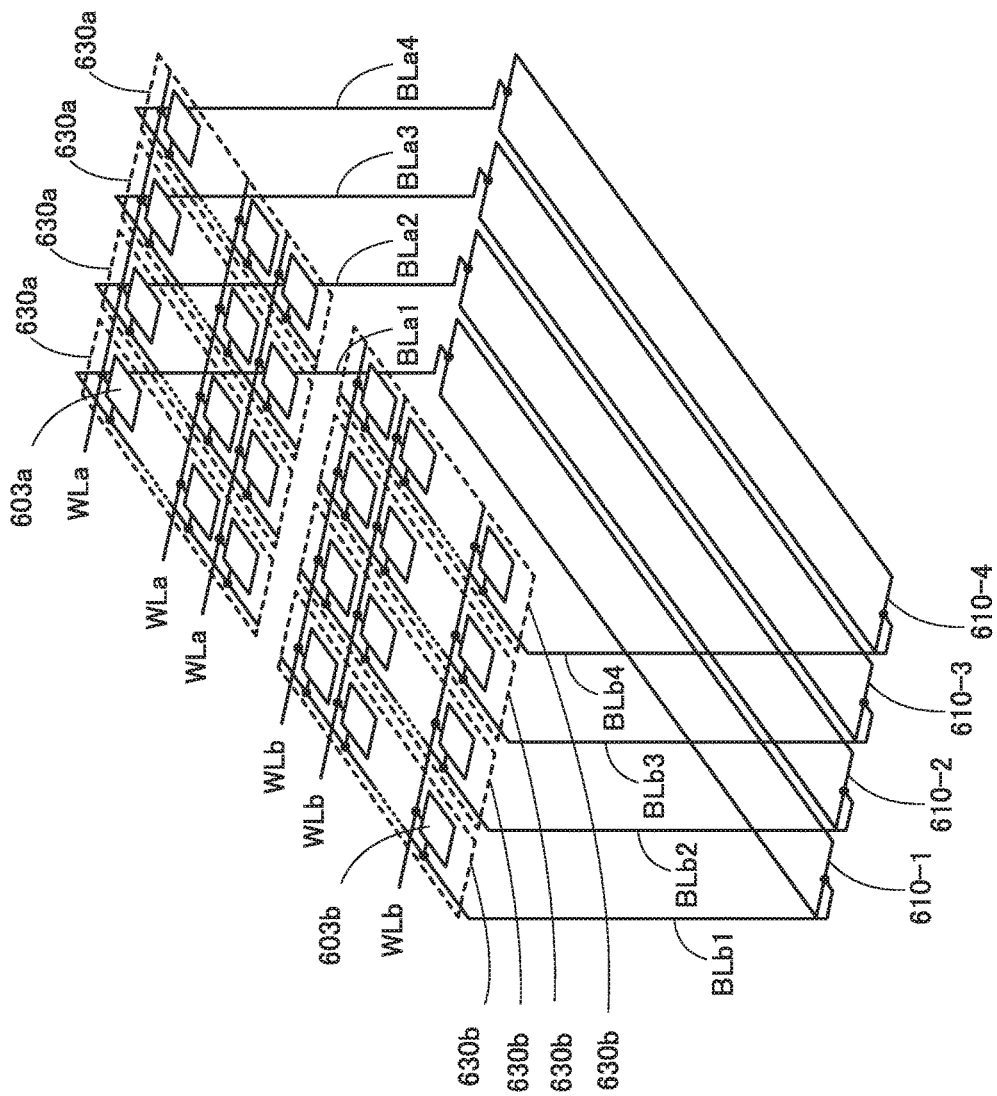
FIG. 13 illustrates a structure of a frame memory.

FIG. 13 illustrates a structure example of the sense amplifiers 610 and the memory cells 603, in which one sense amplifier 610 overlaps with the memory cells 603 electrically connected to the one sense amplifier 610.

FIG. 13 illustrates a case where four sets of one sense amplifier 610 in the first layer and a plurality of memory cells 603a and a plurality of memory cells 603b which are electrically connected to the one sense amplifier 610 are provided. The four sense amplifiers 610 are illustrated as sense amplifiers 610-1, 610-2, 610-3, and 610-4 in FIG. 13. Note that the number of sets included in the frame memory 600 of one embodiment of the present invention may be one, two, three, or more than four.

In FIG. 13, a region 630a including the plurality of memory cells 603a and a region 630b including the plurality of memory cells 603b overlap with one of the sense amplifiers 610 which is electrically connected the plurality of memory cells 603a and 603b.

Note that, in FIG. 13, the sense amplifiers 610-1 to 610-4 are electrically connected to the wirings BLa1 to BLa4, respectively, and to BLb1 to BLb4, respectively. The plurality of memory cells 603a in one of the regions 630a are electrically connected to one of the wirings BLa represented by BLa1 to BLa4. The plurality of memory cells 603b in one of the regions 630b is electrically connected to one of the wirings BLb represented by BLb1 to BLb4.

Four regions 630a in which the memory cells 603a are electrically connected to the respective sense amplifiers 610-1 to 610-4 share a plurality of wirings WLa. Specifically, one wiring WLa is electrically connected to four memory cells 603a electrically connected to the respective wirings BLa1 to BLa4. Similarly, four regions 630b in which the memory cells 603b are electrically connected to the respective sense amplifiers 610-1 to 6104 share a plurality of wirings WLb. Specifically, one wiring WLb is electrically connected to four memory cells 603b electrically connected to the respective wirings BLb1 to BLb4.

The frame memory 600 illustrated in FIG. 13 has an open bit line structure; thus, each wiring BLa intersects the wirings WLa and does not intersect the wirings WLb in the second layer. Similarly, each wiring BLb intersects the wirings WLb and does not intersect the wirings WLa in the second layer.

In the frame memory 600 illustrated in FIG. 13, an open bit line structure is used as an array structure of the memory cells 603, so that the area of the memory array 602 can be smaller than that in a folded bit line structure. Thus, even when a plurality of sense amplifiers 610, which are provided in a layer lower than the memory array 602, are closely arranged in the first layer, a plurality of memory cells 603 corresponding to the respective sense amplifiers 610 can be arranged in the second layer without invading the other memory cell's area. Therefore, with the use of the open-type layout, the layout area of the frame memory 600 can be further reduced and memory capacitance per unit area can be increased in one embodiment of the present invention.

In addition, the memory cells 603 and the sense amplifier 610 are stacked, so that the length of a variety of wirings electrically connecting the memory cells 603 and the sense amplifier 610, such as the wirings BLa, BLb, and the like, can be reduced. Therefore, the resistance of the wirings can be made small, so that reduction in power consumption and high-speed operation are achieved in the frame memory 600.

This embodiment can be combined with any of the other embodiments as appropriate.

Embodiment 5

Figure 17:
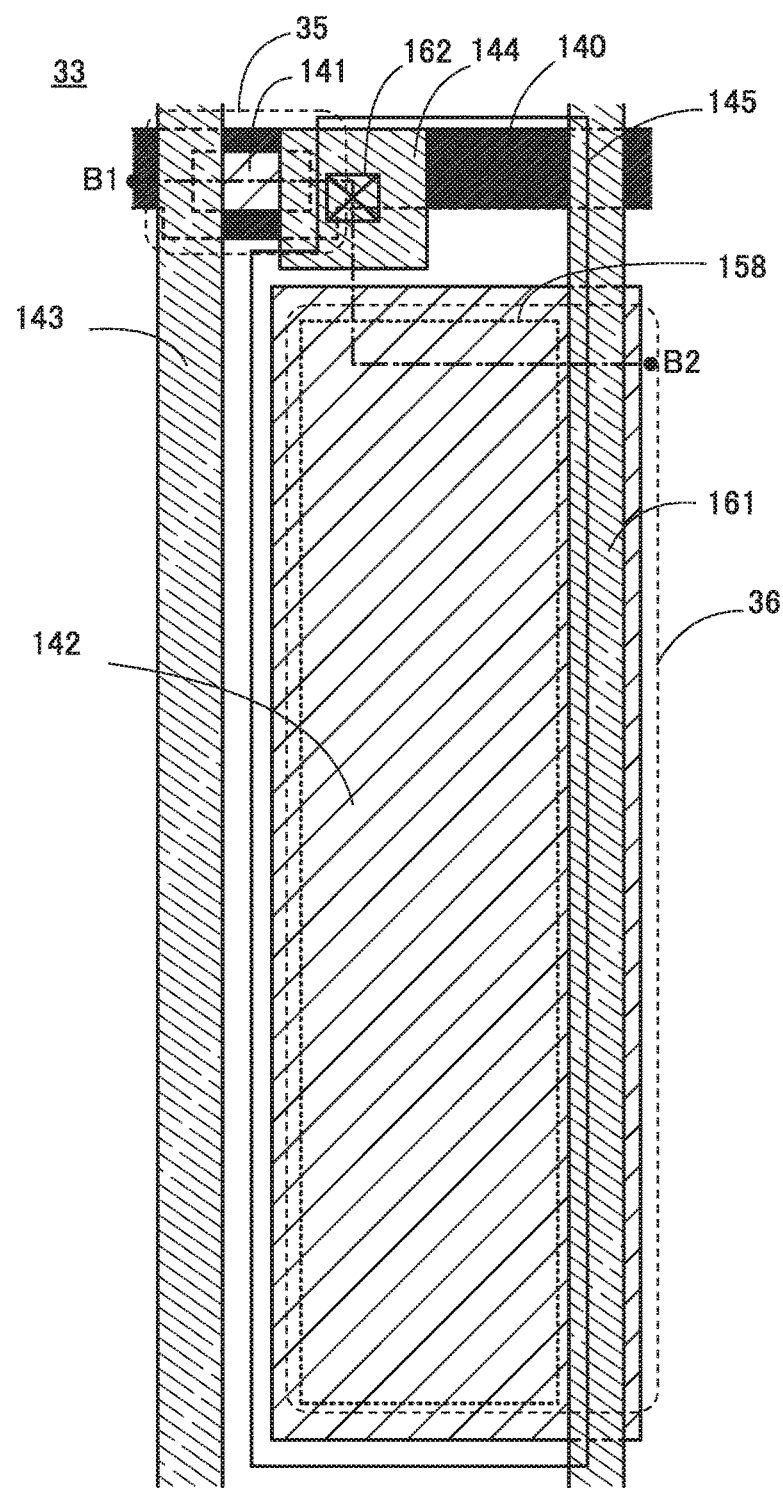
FIG. 17 is a top view of a pixel.
Figure 18:
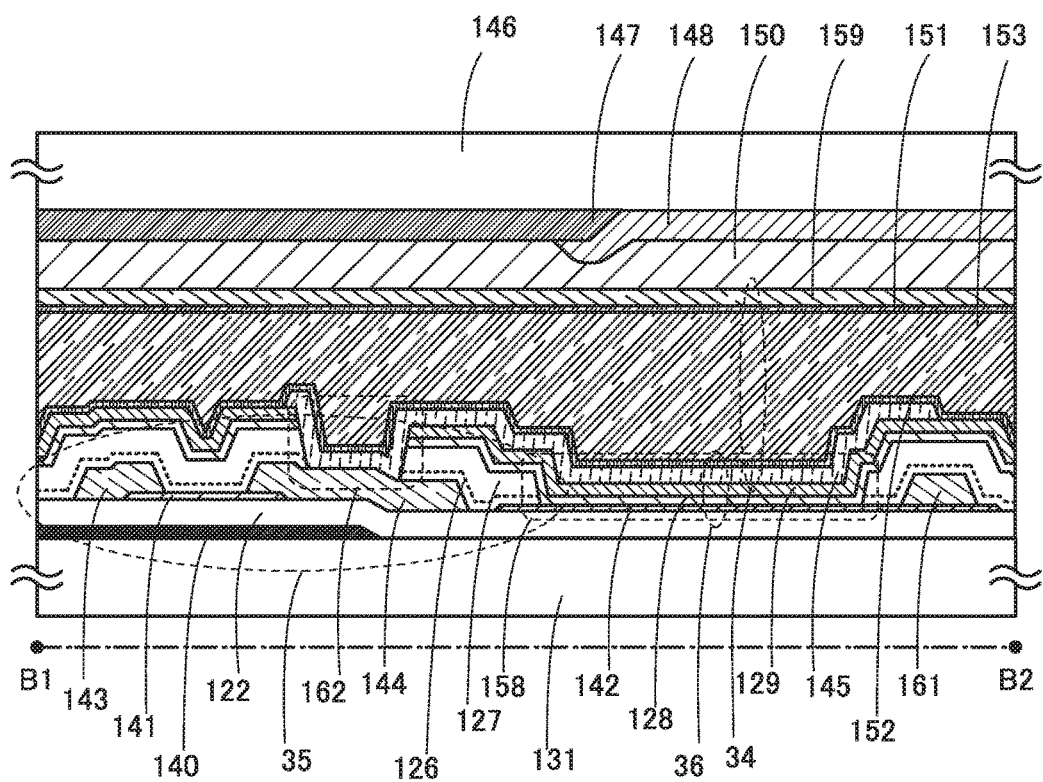
FIG. 18 is a cross-sectional view of the pixel.

Next, a structure example of the pixel 33 in the display device 16 illustrated in FIG. 18 will be described. FIG. 17 is an example of a top view of the pixel 33. Insulating films, liquid crystals, counter electrodes, and a counter substrate are not illustrated in FIG. 17 in order to clarify the layout of the pixel 33. FIG. 18 is a cross-sectional view of the display device 16 including the pixel 33 illustrated in FIG. 17, along the dashed line B1-B2. The element substrate including a first substrate 131 in the display device illustrated in FIG. 18 corresponds to a cross-sectional view of FIG. 17.

The pixel 33 illustrated in FIG. 17 and FIG. 18 includes the transistor 35 and the capacitor 36. In FIG. 18, the pixel 33 includes the liquid crystal element 34.

Over the substrate 131 having an insulating surface, the transistor 35 includes a conductive film 140 having a function as a gate electrode, an insulating film 122 that is over the conductive film 140 and has a function as a gate insulating film, an oxide semiconductor film 141 that is over the insulating film 122 and overlaps with the conductive film 140, and a conductive film 143 and a conductive film 144 that are electrically connected to the oxide semiconductor film 141 and have functions as a source electrode and a drain electrode. The conductive film 140 has a function as the wiring GL illustrated in FIG. 5B. The conductive film 143 has a function as the wiring SL illustrated in FIG. 5B.

The pixel 33 includes a metal oxide film 142 over the insulating film 122. The metal oxide film 142 is a conductive film that transmits visible light. A conductive film 161 electrically connected to the metal oxide film 142 is provided over the metal oxide film 142. The conductive film 161 has a function as a wiring that supplies a predetermined potential to the metal oxide film 142.

In FIG. 18, an insulating film 126 and an insulating film 127 are stacked in this order over the oxide semiconductor film 141, the conductive film 143, and the conductive film 144 and over the metal oxide film 142 and the conductive film 161. The transistor 35 may include the insulating films 126 and 127 as its components. Although the insulating films 126 and 127 are stacked in this order in FIG. 18, a single insulating film or a stack of three or more insulating films may be used instead of the insulating films 126 and 127.

An opening portion 158 is provided in the insulating films 126 and 127 to overlap with the metal oxide film 142. The opening portion 158 is provided in a region overlapping with the metal oxide film 142, and the oxide semiconductor film 141, the conductive film 143, and the conductive film 144 are not provided in the region.

In FIG. 18, a nitride insulating film 128 and an insulating film 129 are stacked in this order over the insulating film 126 and the insulating film 127 and over the metal oxide film 142 in the opening portion 158.

Note that when an oxide semiconductor film is formed over the insulating film 122 and the nitride insulating film 128 is formed in contact with the oxide semiconductor film, the conductivity of the oxide semiconductor film can be increased. In that case, the oxide semiconductor film with high conductivity can be used as the metal oxide film 142. The conductivity of the oxide semiconductor film is increased probably because oxygen vacancies are formed in the oxide semiconductor film at the time of forming the opening portion 158 or the nitride insulating film 128, and hydrogen diffused from the nitride insulating film 128 is bonded to the oxygen vacancies to form a donor. Specifically, the resistivity of the metal oxide film 142 is typically higher than or equal to $1 \times 10^{-3}$ Ωcm and lower than $1 \times 10^{4}$ Ωcm, preferably higher than or equal to $1 \times 10^{-3}$ Ωcm and lower than $1 \times 10^{-1}$ Ωcm.

It is preferable that the metal oxide film 142 have a higher concentration of hydrogen than the oxide semiconductor film 141. In the metal oxide film 142, the concentration of hydrogen measured by secondary ion mass spectrometry (SIMS) is greater than or equal to $8 \times 10^{19}$ atoms/cm$^3$, preferably greater than or equal to $1 \times 10^{20}$ atoms/cm$^3$, further preferably greater than or equal to $5 \times 10^{20}$ atoms/cm$^3$. In the oxide semiconductor film 141, the concentration of hydrogen measured by SIMS is less than $5 \times 10^{19}$ atoms/cm$^3$, preferably less than $5 \times 10^{18}$ atoms/cm$^3$, further preferably less than or equal to $1 \times 10^{18}$ atoms/cm$^3$, still further preferably less than or equal to $5 \times 10^{17}$ atoms/cm$^3$, yet still preferably less than or equal to $1 \times 10^{16}$ atoms/cm$^3$.

For the nitride insulating film 128, silicon nitride, silicon nitride oxide, aluminum nitride, or aluminum nitride oxide can be used, for example. In comparison with an oxide insulating film such as a silicon oxide film and an aluminum oxide film, the nitride insulating film 128 containing any of the above materials can prevent impurities from outside, such as water, alkali metal, and alkaline earth metal, from being diffused into the oxide semiconductor film 141.

Furthermore, an opening portion 162 is provided in the nitride insulating film 128 and the insulating film 129 to overlap with the conductive film 144. A conductive film 145 that transmits visible light and has a function as a pixel electrode is provided over the nitride insulating film 128 and the insulating film 129. The conductive film 145 is electrically connected to the conductive film 144 in the opening portion 162. The conductive film 145 overlaps with the metal oxide film 142 in the opening portion 158. A portion where the conductive film 145 and the metal oxide film 142 overlap with each other with the nitride insulating film 128 and the insulating film 129 positioned therebetween serves as the capacitor 36.

In the capacitor 36, the metal oxide film 142 and the conductive film 145 serving as a pair of electrodes and the nitride insulating film 128 and the insulating film 129 collectively serving as a dielectric film transmit visible light. This means that the capacitor 36 transmits visible light.

Thus, the aperture ratio of the pixel 33 can be higher than that of a pixel including a capacitor with a low visible-light transmitting property. Therefore, while the required capacitance for high image quality can be secured, loss of light in a panel can be reduced and power consumption of a semiconductor device can be reduced.

Note that the insulating film 129 is not necessarily provided. However, the insulating film 129 using an insulator which has a dielectric constant lower than that of the nitride insulating film 128 is used as a dielectric film together with the nitride insulating film 128, so that the dielectric constant of the dielectric film of the capacitor 36 can be adjusted to a desired value without increasing the thickness of the nitride insulating film 128.

An alignment film 152 is provided over the conductive film 145.

A substrate 146 is provided to face the substrate 131. The substrate 146 is provided with a blocking film 147 having a function of blocking visible light, and a coloring layer 148 transmitting visible light in a specific wavelength range. A resin film 150 is provided over the blocking film 147 and the coloring layer 148, and a conductive film 159 having a function as a common electrode is provided over the resin film 150. An alignment film 151 is provided over the conductive film 159.

Between the substrate 131 and the substrate 146, a liquid crystal layer 153 containing a liquid crystal material is interposed between the alignment film 152 and the alignment film 151. The liquid crystal element 34 includes the conductive film 145, the conductive film 159, and the liquid crystal layer 153.

Although a twisted nematic (TN) mode is used as a method for driving the liquid crystal in FIG. 17 and FIG. 18, the following can be used as a method for driving the liquid crystal: a fringe field switching (FFS) mode, a super twisted nematic (STN) mode, a vertical alignment (VA) mode, a multi-domain vertical alignment (MVA) mode, an in-plane-switching (IPS) mode, an optically compensated birefringence (OCB) mode, a blue phase mode, a transverse bend alignment (TBA) mode, a VA-IPS mode, an electrically controlled birefringence (ECB) mode, a ferroelectric liquid crystal (FLC) mode, an anti-ferroelectric liquid crystal (AFLC) mode, a polymer dispersed liquid crystal (PDLC) mode, a polymer network liquid crystal (PNLC) mode, a guest-host mode, an advanced super view (ASV) mode, and the like.

In a liquid crystal display device of one embodiment of the present invention, the liquid crystal layer can be formed using, for example, a liquid crystal material classified into a thermotropic liquid crystal or a lyotropic liquid crystal. As another example of a liquid crystal material used for the liquid crystal layer, the following can be given: a nematic liquid crystal, a smectic liquid crystal, a cholesteric liquid crystal, or a discotic liquid crystal. Alternatively, a liquid crystal material classified into a ferroelectric liquid crystal or an anti-ferroelectric liquid crystal can be used for the liquid crystal layer, for example. Further alternatively, a liquid crystal material classified into a high-molecular liquid crystal such as a main-chain high-molecular liquid crystal, a side-chain high-molecular liquid crystal, or a composite-type high-molecular liquid crystal, or a low-molecular liquid crystal can be used for the liquid crystal layer, for example. Further alternatively, a liquid crystal material classified into a polymer dispersed liquid crystal (PDLC) can be used for the liquid crystal layer, for example.

Alternatively, a liquid crystal exhibiting a blue phase for which an alignment film is not used may be used for the liquid crystal layer. A blue phase is one of liquid crystal phases, which is generated just before a cholesteric phase changes into an isotropic phase while temperature of cholesteric liquid crystal is increased. Since the blue phase is only generated within a narrow range of temperature, a chiral material or an ultraviolet curable resin is added so that the temperature range is improved. A liquid crystal composition including a liquid crystal exhibiting a blue phase and a chiral material is preferable because it has a short response time of 1 millisecond or less, and is optically isotropic, which makes the alignment process unneeded and viewing angle dependence small.

Although a liquid crystal display device using a color filter to display a color image is illustrated in FIG. 18 as an example, the liquid crystal display device of one embodiment of the present invention may display a color image by sequentially turning on a plurality of light sources having different hues.

This embodiment can be combined with any of the other embodiments as appropriate.

Embodiment 6

Next, a configuration example of a transistor used as the transistor 613 included in the memory cell 603-1 or 603-2 illustrated in FIG. 12 will be described.

FIG. 19A is a top view illustrating a structure example of a transistor. FIG. 19B is a cross-sectional view taken along line X1-X2 in FIG. 19A. FIG. 19C is a cross-sectional view taken along line Y1-Y2 in FIG. 19A. In some cases, the direction of line X1-X2 is referred to as a channel length direction, and the direction of line Y1-Y2 is referred to as a channel width direction. Accordingly, FIG. 19B illustrates a cross-sectional structure of the transistor in the channel length direction, and FIG. 19C illustrates a cross-sectional structure of the transistor in the channel width direction. Note that, to clarify the device structure, FIG. 19A does not illustrate some components.

A transistor 501 includes insulating layers 512 to 519, metal oxide films 521 to 523, and conductive layers 540 to 544. The transistor 501 is formed over an insulating surface, here, over an insulating layer 511. The transistor 501 is covered with the insulating layers 518 and 519.

Note that the insulating layers, the metal oxide films, and the conductive layers included in the transistor may each have either a single-layer structure or a layered structure. They can be formed by any of a variety of deposition methods such as a sputtering method, a molecular beam epitaxy (MBE) method, a pulsed laser ablation (PLA) method, a CVD method, an ALD method, and the like. Note that examples of CVD methods include a plasma-enhanced CVD method, a thermal CVD method, a metal organic CVD method, and the like.

The metal oxide films 521 to 523 are collectively referred to as an oxide layer 520. As illustrated in FIGS. 19B and 19C, the oxide layer 520 includes a portion where the metal oxide film 521, the metal oxide film 522, and the metal oxide film 523 are stacked in that order. When the transistor 501 is on, a channel is mainly formed in the metal oxide film 522 of the oxide layer 520.

A gate electrode of the transistor 501 is formed using the conductive layer 540. A pair of electrodes functioning as a source electrode and a drain electrode are formed using the conductive layers 541 and 540. A back gate electrode is formed using the conductive layers 543 and 544. A gate insulating layer on a gate (front gate) side is formed using the insulating layer 517. A gate insulating layer on a back gate side is formed using a stack of the insulating layers 514 to 516. The insulating layer 518 is an interlayer insulating layer. The insulating layer 519 is a barrier layer.

The metal oxide film 523 covers a stack of the metal oxide films 521 and 522 and the conductive layers 541 and 542. The insulating layer 517 covers the metal oxide film 523. The conductive layers 541 and 542 each include a region that overlaps with the conductive layer 540 with the metal oxide film 523 and the insulating layer 515 positioned therebetween.

The conductive layer 541 and the conductive layer 542 in the transistor 501 are formed using a hard mask used for forming the stack of the metal oxide films 521 and 522. Therefore, the conductive layers 541 and 542 do not have regions in contact with the side surfaces of the metal oxide films 521 and 522. For example, the metal oxide layers 521 and 522 and the conductive layers 541 and 542 can be formed through the following steps. A two-layer metal oxide film is formed. A conductive film is formed over the two-layer metal oxide film. This conductive film is etched, so that a hard mask is formed. With the use of this hard mask, the two-layer metal oxide film is etched to form the stack of the metal oxide layers 521 and 522. Then, the hard mask is etched to form the conductive layers 541 and 542.

Examples of insulating materials used for the insulating layers 511 to 518 include, there is aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, aluminum silicate, and the like. The insulating layers 511 to 518 are formed using a single-layer structure or a layered structure of these insulating materials. The layers used for the insulating layers 511 to 518 may include a plurality of insulating materials.

Note that in this specification and the like, an oxynitride refers to a substance that contains more oxygen than nitrogen, and a nitride oxide refers to a substance that contains more nitrogen than oxygen.

In order to suppress the increase in oxygen vacancies in the oxide layer 520, the insulating layers 516 to 518 preferably contain oxygen. Further preferably, the insulating layers 516, 517, and 518 are formed using an insulating film from which oxygen is released by heating (hereinafter such an insulating film is referred to as an "insulating film containing excess oxygen"). Oxygen is supplied from the insulating layer containing excess oxygen to the oxide layer 520, so that the oxygen vacancies in the oxide layer 520 can be compensated. The reliability and electrical characteristics of the transistor 501 can be improved.

The insulating film containing excess oxygen is a film from which oxygen molecules at more than or equal to $1.0 \times 10^{18}$ molecules/cm$^3$ are released in thermal desorption spectroscopy (TDS) at a surface temperature of the film of higher than or equal to 100° C. and lower than or equal to 700° C., or higher than or equal to 100° C. and lower than or equal to 500° C. The amount of released oxygen molecules is preferably more than $3.0 \times 10^{20}$ atoms/cm$^3$.

The insulating film containing excess oxygen can be formed by performing treatment for adding oxygen to an insulating film. The treatment for adding oxygen can be performed by heat treatment in an oxygen atmosphere, ion implantation, ion doping, plasma immersion ion implantation, plasma treatment, or the like. As a gas for adding oxygen, an oxygen gas of $^{16}O_2$, $^{18}O_2$, or the like, a nitrous oxide gas, an ozone gas, or the like can be used.

The concentration of hydrogen in the insulating layers 512 to 519 is preferably low in order to prevent an increase in the concentration of hydrogen in the oxide layer 520. In particular, the concentration of hydrogen in the insulating layers 513 to 518 is preferably be low. Specifically, the concentration of hydrogen is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$.

The concentration of nitrogen in the insulating layers 513 to 518 is preferably low in order to prevent an increase in the concentration of nitrogen in the oxide layer 520. Specifically, the concentration of nitrogen is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

The hydrogen concentration and the nitrogen concentration are measured by secondary ion mass spectrometry (SIMS).

In the transistor 501, the oxide layer 520 is preferably surrounded by an insulating layer with oxygen and hydrogen barrier properties (hereinafter such an insulating layer is referred to as a barrier layer). With such a structure, it is possible to suppress the release of oxygen from the oxide layer 520 and entry of hydrogen into the oxide layer 520; thus, the reliability and electrical characteristics of the transistor 501 can be improved.

For example, the insulating layer 519 functions as a barrier layer and at least one of the insulating layers 511, 512, and 514 functions as a barrier layer. The barrier layer can be formed using a material such as aluminum oxide, aluminum oxynitride, gallium oxide, gallium oxynitride, yttrium oxide, yttrium oxynitride, hafnium oxide, hafnium oxynitride, silicon nitride, or the like.

A structure example of the insulating layers 511 to 518 will be described. In this example, each of the insulating layers 511, 512, 515, and 519 functions as a barrier layer. The insulating layers 516 to 518 are oxide layers containing excess oxygen. The insulating layer 511 is formed using a silicon nitride. The insulating layer 512 is formed using aluminum oxide. The insulating layer 513 is formed using silicon oxynitride. The gate insulating layers (514 to 516) on the back gate side is formed using a stack of silicon oxide, aluminum oxide, and silicon oxide. The gate insulating layer (517) on the front gate side is formed using silicon oxynitride. The interlayer insulating layer (518) is formed using silicon oxide. The insulating layer 519 is formed using aluminum oxide.

Examples of a conductive material used for the conductive layers 540 to 544 include a metal such as molybdenum, titanium, tantalum, tungsten, aluminum, copper, chromium, neodymium, or scandium; metal nitride containing any of the above metals as its component (e.g., tantalum nitride, titanium nitride, molybdenum nitride, or tungsten nitride); or the like. A conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can be used.

A structure example of the conductive layers 540 to 544 will be described. The conductive layer 540 is a single layer of tantalum nitride or tungsten. Alternatively, the conductive layer 540 is a stack of tantalum nitride, tantalum, and tantalum nitride. The conductive layer 541 is a single layer of tantalum nitride, or a stack of tantalum nitride and tungsten. The conductive layer 542 has the same structure as that of the conductive layer 541. The conductive layer 543 is formed using tantalum nitride, and the conductor is formed using tungsten.

In order to reduce the off-state current of the transistor 501, for example, the energy gap of the metal oxide film 522 is preferably large. The energy gap of the metal oxide film 522 is greater than or equal to 2.5 eV and less than or equal to 4.2 eV, preferably greater than or equal to 2.8 eV and less than or equal to 3.8 eV, further preferably greater than or equal to 3 eV and less than or equal to 3.5 eV.

The oxide layer 520 is preferably a crystalline metal oxide film. In the oxide layer 520, at least the metal oxide film 522 is preferably a crystalline metal oxide film. The transistor 501 can have high reliability and favorable electrical characteristics.

As the oxide of the metal oxide film 522, typically, an In—Ga oxide, an In—Zn oxide, or an In-M-Zn oxide film (M is Al, Ga, Y, or Sn) can be used. The metal oxide film 522 is not limited to the oxide layer containing indium. The metal oxide film 522 can be formed using a Zn—Sn oxide, a Ga—Sn oxide, or a Zn—Mg oxide, for example. The metal oxide films 521 and 523 can be also formed using an oxide that is similar to the oxide of the metal oxide film 522. The metal oxide films 521 and 523 can be formed using a Ga oxide.

When an interface state is formed at an interface between the metal oxide film 522 and the metal oxide film 521, a channel region is also formed in a region close to the interface; thus, the threshold voltage of the transistor 501 varies. Therefore, it is preferable that the metal oxide film 521 contain at least one of the metal elements contained in the metal oxide film 522 as its component. Accordingly, an interface state is hardly formed at the interface between the metal oxide film 522 and the metal oxide film 523, and variations in the electrical characteristics of the transistor 501, such as the threshold voltage, can be reduced.

The metal oxide film 523 preferably contains at least one of the metal elements contained in the metal oxide film 522 as its component because interface scattering is unlikely to occur at the interface between the metal oxide film 522 and the metal oxide film 523, and carrier transfer is not inhibited. Thus, the field-effect mobility of the transistor 501 can be increased.

It is preferable that the metal oxide film 522 have the highest carrier mobility among the metal oxide films 521 to 523. Accordingly, a channel can be formed in the metal oxide film 522 that is apart from the insulating layers 516 and 517.

For example, in a metal oxide containing indium such as an In-M-Zn oxide, carrier mobility can be increased by an increase in the indium content. In the In-M-Zn oxide, the s orbital of heavy metal mainly contributes to carrier transfer, and when the indium content in the oxide semiconductor is increased, overlaps of the s orbitals of indium atoms are increased; therefore, an oxide having a high content of indium has higher mobility than an oxide having a low content of indium. Therefore, an oxide having a high content of indium is used as an oxide semiconductor film, so that carrier mobility can be increased.

Thus, for example, the metal oxide film 522 is formed using an In—Ga—Zn oxide, and the metal oxide films 521 and 523 are formed using a Ga oxide. For example, when the metal oxide films 521 to 523 are formed using an In-M-Zn oxide, the indium content of the metal oxide film 522 is made higher than the indium content of the metal oxide films 521 and 523. When the In-M-Zn oxide is formed by sputtering, the indium content can be changed by a change in the atomic ratio of meta elements of a target.

For example, it is preferable that the atomic ratio of metal elements of a target used for depositing the metal oxide film 522 be In:M:Zn=1:1:1, 3:1:2, or 4:2:4.1. For example, it is preferable that the atomic ratio of metal elements of a target used for depositing the metal oxide films 521 and 523 be In:M:Zn=1:3:2, or 1:3:4. The atomic ratio of an In-M-Zn oxide deposited using a target of In:M:Zn=4:2:4.1 is approximately In:M:Zn=4:2:3.

In order that the transistor 501 have stable electrical characteristics, it is preferable to reduce the concentration of impurities in the oxide layer 520. In the metal oxide, hydrogen, nitrogen, carbon, silicon, and a metal element other than a main component are impurities. For example, hydrogen and nitrogen form donor levels to increase the carrier density, and silicon and carbon form impurity levels in the oxide semiconductor. The impurity levels serve as traps and might cause deterioration of electrical characteristics of the transistor.

For example, the oxide layer 520 includes a region where the concentration of silicon is lower than or equal to $2 \times 10^{18}$ atoms/cm$^3$, or preferably lower than or equal to $2 \times 10^{17}$ atoms/cm$^3$. The same applies to the concentration of carbon in the oxide layer 520.

The oxide layer 520 includes a region where the concentration of alkali metal is lower than or equal to $1 \times 10^{18}$ atoms/cm$^3$, or preferably lower than or equal to $2 \times 10^{16}$ atoms/cm$^3$. The same applies to the concentration of alkaline earth metal in the metal oxide film 522.

The oxide layer 520 includes a region where the concentration of nitrogen is lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, still further preferably lower than or equal to $5 \times 10^{17}$ atoms/cm$^3$.

The oxide layer 520 includes a region where the concentration of hydrogen is lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$.

The above concentrations of the impurities in the metal oxide film 522 are measured by SIMS.

In the case where the metal oxide film 522 contains oxygen vacancies, donor levels are formed by entry of hydrogen into sites of oxygen vacancies in some cases to cause reduction in the on-state current of the transistor 501. Note that sites of oxygen vacancies become more stable by entry of oxygen than by entry of hydrogen. Thus, by reducing oxygen vacancies in the metal oxide film 522, the on-state current of the transistor 501 can be increased in some cases. Consequently, preventing entry of hydrogen into sites of oxygen vacancies by a reduction in hydrogen in the metal oxide film 522 is effective in improving on-state current characteristics.

Hydrogen contained in a metal oxide reacts with oxygen bonded to a metal atom to be water, and thus causes an oxygen vacancy, in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, the transistor 501 is likely to be normally-on when the metal oxide film 522 contains hydrogen because the metal oxide film 522 includes a channel formation region. Accordingly, it is preferable that hydrogen in the metal oxide film 522 be reduced as much as possible.

FIGS. 19A to 19C illustrate examples in which the oxide layer 520 has a three-layer structure; however, one embodiment of the present invention is not limited thereto. For example, the oxide layer 520 can have a two-layer structure without the metal oxide layer 521 or without the metal oxide film 523. Alternatively, the oxide layer 520 may have a four-layer structure in which any one of the oxide semiconductor layers described as the metal oxide layers 521 to 523 is provided below or over the metal oxide film 522 or below or over the metal oxide film 523. Alternatively, the oxide layer 520 may include one or more metal oxide films that are similar to the metal oxide films 521 to 523 at two or more of the following positions: between given layers in the oxide layer 520, over the oxide layer 520, and below the oxide layer 520.

Figure 22:
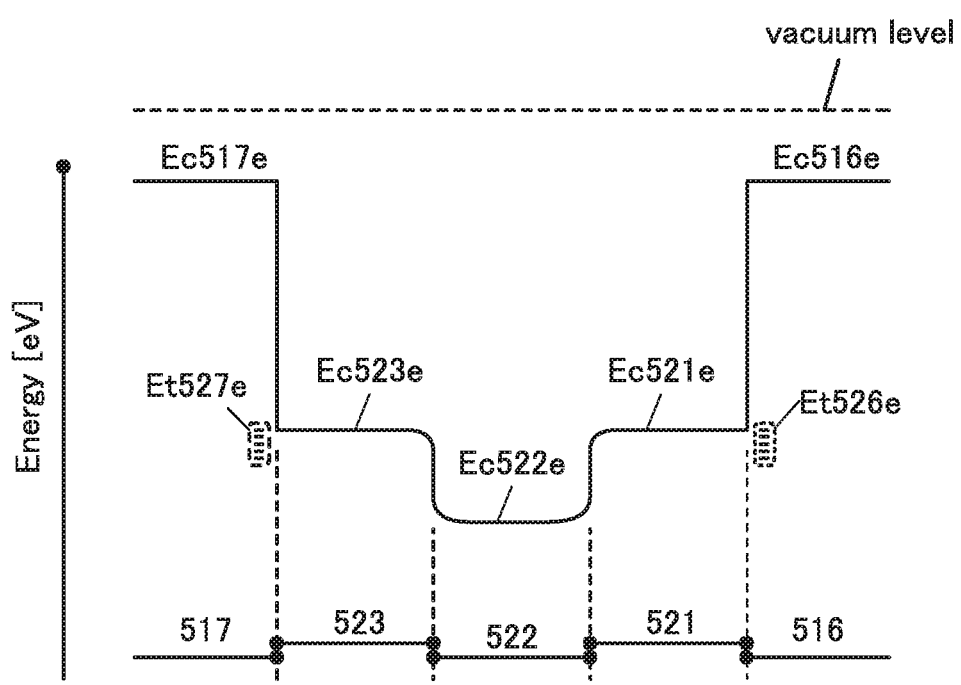
FIG. 22 is a schematic diagram of an energy band structure.

Effects of the stack of the metal oxide films 521 to 523 will be described with reference to FIG. 22. FIG. 22 is a schematic diagram showing the energy band structure of a channel formation region of the transistor 501. Although the transistor 501 is described here as an example, effects of the stack of the metal oxide films 521 to 523 in the transistors 502 and 503 to be described later are also similar to those in the transistor 501.

In FIG. 22, Ec516e, Ec521e, Ec522e, Ec523e, and Ec517e indicate the energy at the bottom of the conduction band of the insulating layer 516, the metal oxide film 521, the metal oxide film 522, the metal oxide film 523, and the insulating layer 517, respectively.

Here, a difference in energy between the vacuum level and the bottom of the conduction band (the difference is also referred to as electron affinity) corresponds to a value obtained by subtracting an energy gap from a difference in energy between the vacuum level and the top of the valence band (the difference is also referred to as an ionization potential). The energy gap can be measured using a spectroscopic ellipsometer (UT-300 manufactured by HORIBA JOBIN YVON S.A.S.). The difference in energy between the vacuum level and the top of the valence band can be measured using an ultraviolet photoelectron spectroscopy (UPS) device (VersaProbe manufactured by ULVAC-PHI, Inc.).

Since the insulating layers 512 and 513 are insulators, Ec512e and Ec513e are closer to the vacuum level than Ec521e, Ec522e, and Ec523e (i.e., the insulating layers 512 and 513 have a lower electron affinity than the metal oxides layers 521 to 523).

The metal oxide film 522 has a higher electron affinity than the metal oxide films 521 and 523. For example, the difference in electron affinity between the metal oxide films 521 and 522 and the difference in electron affinity between the metal oxide films 522 and 523 are each greater than or equal to 0.07 eV and less than or equal to 1.3 eV, preferably greater than or equal to 0.1 eV and less than or equal to 0.7 eV, further preferably greater than or equal to 0.15 eV and less than or equal to 0.4 eV. Note that the electron affinity is a difference in energy between the vacuum level and the bottom of the conduction band.

When voltage is applied to the gate electrode (the conductive layer 530) of the transistor 501, a channel is mainly formed in the metal oxide film 522 having the highest electron affinity among the metal oxide films 521 to 523.

An indium gallium oxide has low electron affinity and a high oxygen-blocking property. Therefore, the metal oxide film 523 preferably includes an indium gallium oxide. The gallium atomic ratio [Ga/(In+Ga)] is, for example, higher than or equal to 70%, preferably higher than or equal to 80%, further preferably higher than or equal to 90%.

In some cases, there is a mixed region of the metal oxide films 521 and 522 between the metal oxide films 521 and 522. Furthermore, in some cases, there is a mixed region of the metal oxide films 522 and 523 between the metal oxide films 522 and 523. Because the mixed region has low interface state density, a stack of the metal oxide films 521 to 523 (the oxide layer 520) has a band structure where energy at each interface and in the vicinity of the interface is changed continuously (continuous junction).

Electrons transfer mainly through the metal oxide film 522 in the oxide layer 520 having such an energy band structure. Therefore, even when an interface state exists at an interface between the metal oxide film 521 and the insulating layer 512 or an interface between the metal oxide film 523 and the insulating layer 513, electron movement in the oxide layer 520 is less likely to be inhibited and the on-state current of the transistor 501 can be increased.

Although trap states Et526e and Et527e due to impurities or defects might be formed in the vicinity of the interface between the metal oxide film 521 and the insulating layer 516 and the vicinity of the interface between the metal oxide film 523 and the insulating layer 517 as illustrated in FIG. 22, the metal oxide film 522 can be separated from the trap states Et526e and Et527e owing to the existence of the metal oxide films 521 and 523.

Note that when a difference in energy between Ec521e and Ec522e is small, an electron in the metal oxide film 522 might reach the trap state Et 526e by passing over the difference in energy. Since the electron is trapped at the trap state Et 526e, negative fixed charge is generated at the interface with the insulating film, causing the threshold voltage of the transistor to be shifted in a positive direction. The same applies to the case where a difference in energy between Ec521e and Ec523e is small.

Each of the difference in energy between Ec521e and Ec522e and the difference in energy between Ec522e and Ec523e is preferably greater than or equal to 0.1 eV, further preferably greater than or equal to 0.15 eV so that a change in the threshold voltage of the transistor 501 can be reduced and the transistor 501 can have favorable electrical characteristics.

Figure 20A:
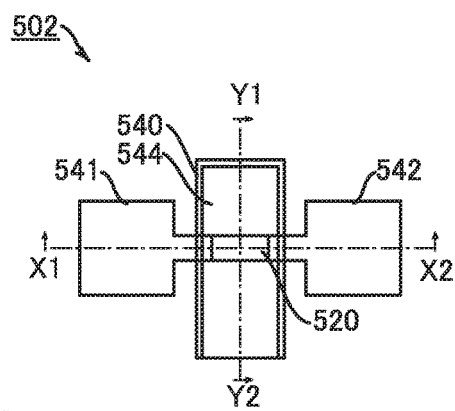
FIGS. 20A to 20C illustrate a structure of a transistor.
Figures 20B, 20C:
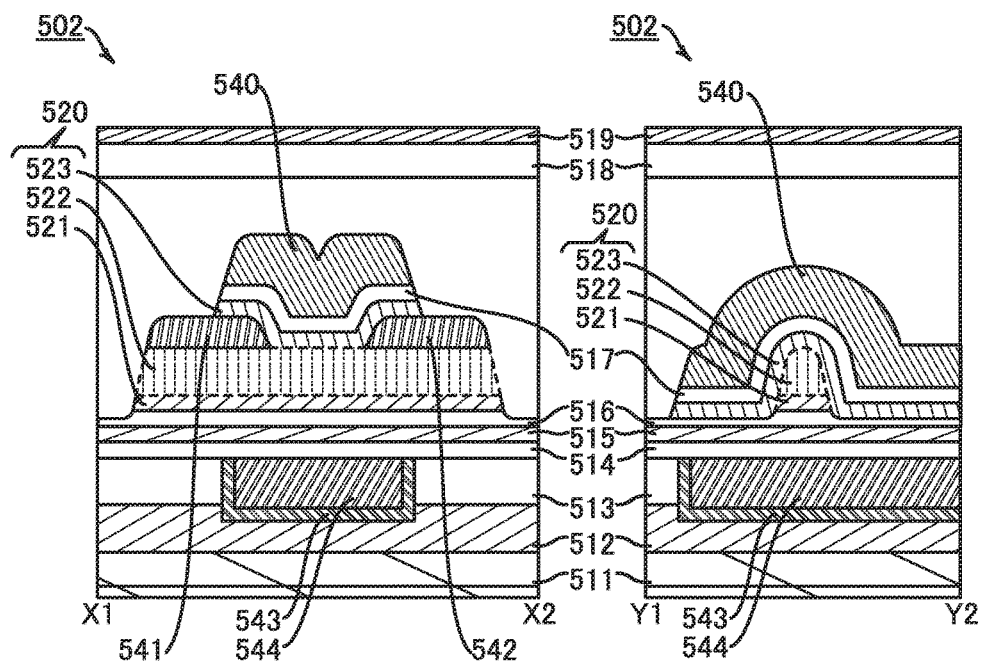

The transistor 502 illustrated in FIGS. 20A to 20C is a modification example of the transistor 501. In the transistor 502, the conductive layer 540, the metal oxide film 523, and the insulating layer 517 are etched.

Figure 21A:
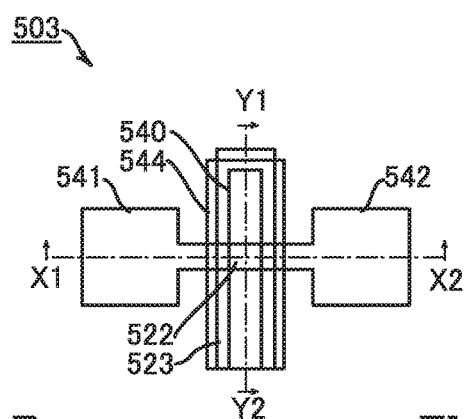
FIGS. 21A to 21C illustrate a structure of a transistor.
Figures 21B, 21C:
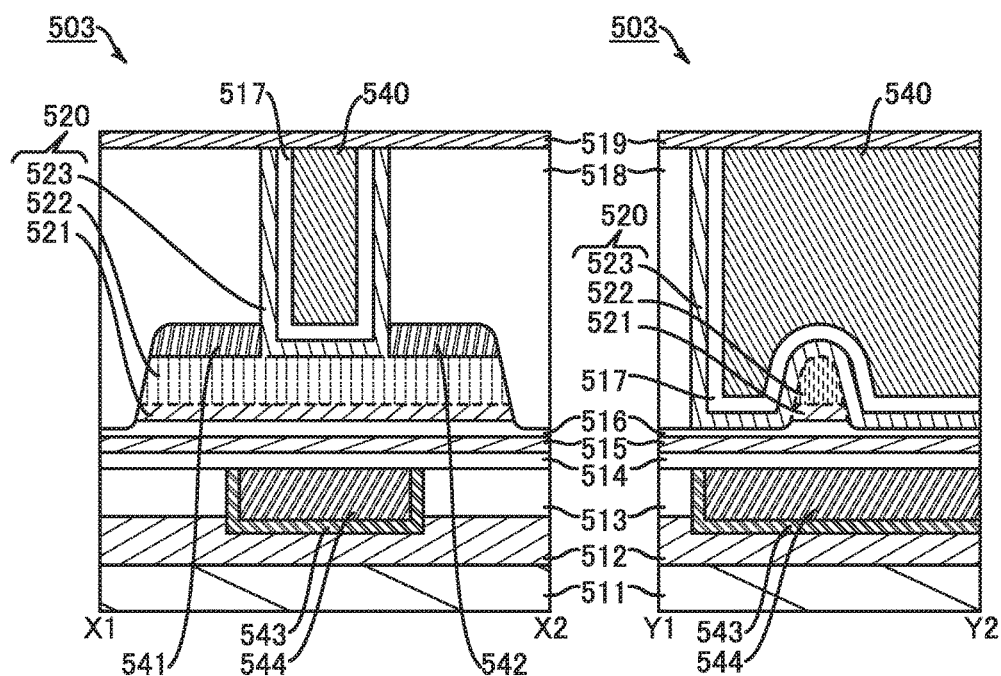

The OS transistor 503 illustrated in FIGS. 21A to 21C differs from the transistor 501 in the structure of the gate electrode.

The metal oxide film 523, the insulating layer 517, and the conductive layer 540 are provided in an opening portion formed in the insulating layer 518. In other words, a gate electrode can be formed in a self-aligning manner by using the opening portion in the insulating layer 518. Thus, in the transistor 503, a gate electrode (540) does not include a region that overlaps with a source electrode and a drain electrode (541 and 542) with a gate insulating layer (517) positioned therebetween. Accordingly, gate-source parasitic capacitance and gate-drain parasitic capacitance can be reduced. Furthermore, gate electrode width can be controlled by the opening portion in the insulating layer 518; thus, it is easy to fabricate a transistor with short channel length.

The transistors 501 to 503 do not necessarily include a back gate.

Figure 23:
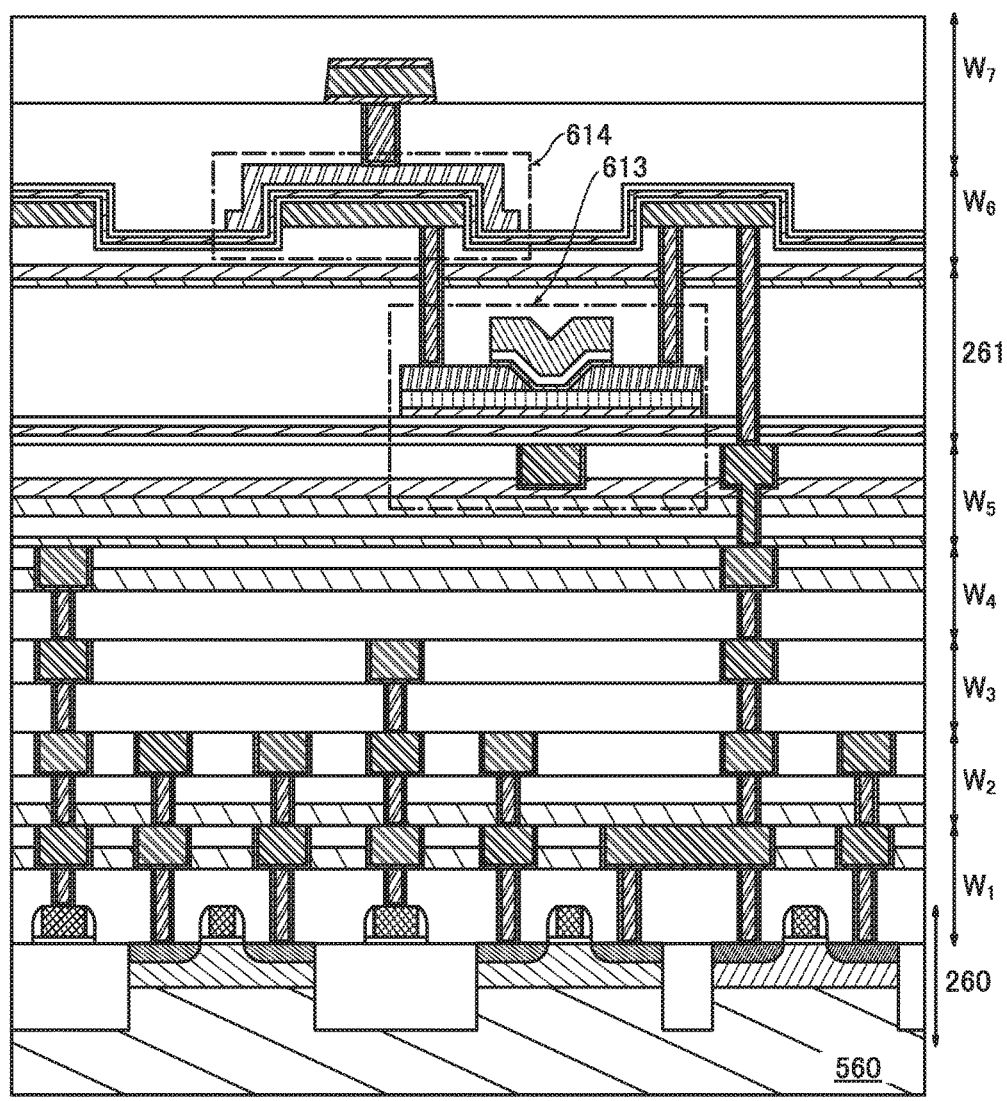
FIG. 23 illustrates a cross-sectional structure of a semiconductor device.

FIG. 23 illustrates a stack structure of the transistor 613 (FIG. 12) included in the memory cell 603 of the frame memory 600 and a transistor included in the driver circuit 604 of the frame memory 600.

The frame memory 600 includes a stack of a CMOS layer 260, wiring layers $W_1$ to $W_5$, a transistor layer 261, and wiring layers $W_6$ and $W_7$.

The CMOS layer 260 is provided with a transistor which includes silicon in its channel formation region and which is used for the driver circuit 604. An active layer of the transistor is formed using a single crystalline silicon wafer 560.

The transistor layer 261 is provided with the transistor 613 of the frame memory 600. In FIG. 23, the transistor 613 has a structure similar to that of the transistor 502 (FIGS. 20A to 20C). The back gates of these transistors are formed in the wiring layer $W_5$. In addition, the wiring layer $W_6$ is provided with the capacitor 614 of the frame memory 600.

This embodiment can be combined with any of the other embodiments as appropriate.

Embodiment 7

In this embodiment, an oxide semiconductor will be described. An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not to have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

A CAAC-OS is an oxide semiconductor having a plurality of c-axis aligned crystal parts (also referred to as pellets).

The CAAC-OS has c-axis alignment, its crystal parts (nanocrystals) are connected in an a-b plane direction, and the crystal structure has distortion. The size of the crystal part is greater than or equal to 1 nm, or greater than or equal to 3 nm. For this reason, the crystal part of the CAAC-OS can be referred to as a nanocrystal, and the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. For example, impurities contained in the oxide semiconductor might serve as carrier traps or carrier generation sources. For example, oxygen vacancy in the oxide semiconductor might serve as carrier traps or serve as carrier generation sources when hydrogen is captured therein.

The CAAC-OS having small amounts of impurities and oxygen vacancies is an oxide semiconductor with a low carrier density, specifically, lower than $8 \times 10^{11}/cm^3$, preferably lower than $1 \times 10^{11}/cm^3$, or further preferably lower than $1 \times 10^{10}/cm^3$, and higher than or equal to $1 \times 10^{-9}/cm^3$. Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different crystal parts in the nc-OS. Thus, the orientation of the whole film is not observed. Since there is no regularity of crystal orientation between the crystal parts (nanocrystals), the nc-OS can also be referred to as an oxide semiconductor including randomly aligned nanocrystals (RANC) or an oxide semiconductor including non-aligned nanocrystals (NANC).

Since the crystal of the nc-OS does not have alignment, the nc-OS cannot be distinguished from an a-like OS or an amorphous oxide semiconductor in some cases depending on an analysis method.

Note that the a-like OS has lower density than the nc-OS and the CAAC-OS. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. It is difficult to deposit an oxide semiconductor whose density is lower than 78% of the density of the single crystal oxide semiconductor.

For example, in the case of an oxide semiconductor with an atomic ratio of In:Ga:Zn=1:1:1, the density of single crystal $InGaZnO_4$ with a rhombohedral crystal structure is 6.357 $g/cm^3$. Thus, for example, in the case of the oxide semiconductor with an atomic ratio of In:Ga:Zn=1:1:1, the density of an a-like OS is higher than or equal to 5.0 $g/cm^3$ and lower than 5.9 $g/cm^3$. In addition, for example, in the case of the oxide semiconductor with an atomic ratio of In:Ga:Zn=1:1:1, the density of an nc-OS or a CAAC-OS is higher than or equal to 5.9 $g/cm^3$ and lower than 6.3 $g/cm^3$.

Note that in the case where single crystals with the same composition do not exist, by combining single crystals with different compositions at a given proportion, it is possible to estimate density that corresponds to the density of a single crystal with a desired composition. The density of the single crystal with a desired composition may be estimated using weighted average with respect to the combination ratio of the single crystals with different compositions. Note that it is preferable to combine as few kinds of single crystals as possible for density estimation.

As described above, oxide semiconductors have various structures and various properties. Note that an oxide semiconductor may be a stacked film including two or more of an amorphous oxide semiconductor, an a-like OS, an nc-OS, and a CAAC-OS, for example. The structure of the oxide semiconductor can be identified by X-ray diffraction (XRD), nanobeam electron diffraction, observation with a transmission electron microscope (TEM), or the like.

Next, the carrier density of an oxide semiconductor will be described.

Examples of a factor affecting the carrier density of an oxide semiconductor include oxygen vacancy (Vo) and impurities in the oxide semiconductor.

As the amount of oxygen vacancy in the oxide semiconductor increases, the density of defect states increases when hydrogen is bonded to the oxygen vacancy (this state is also referred to as VoH). The density of defect states also increases with an increase in the amount of impurity in the oxide semiconductor. Hence, the carrier density of an oxide semiconductor can be controlled by controlling the density of defect states in the oxide semiconductor.

A transistor using the oxide semiconductor in a channel region will be described below.

The carrier density of the oxide semiconductor is preferably reduced in order to inhibit the negative shift of the threshold voltage of the transistor or reduce the off-state current of the transistor. In order to reduce the carrier density of the oxide semiconductor, the impurity concentration in the oxide semiconductor is reduced so that the density of defect states can be reduced. In this specification and the like, a state with a low impurity concentration and a low density of defect states is referred to as a highly purified intrinsic or substantially highly purified intrinsic state. The carrier density of a highly purified intrinsic oxide semiconductor is lower than $8 \times 10^{15}$ $cm^{-3}$, preferably lower than $1 \times 10^{11}$ $cm^{-3}$, and further preferably lower than $1 \times 10^{10}$ $cm^{-3}$ and is higher than or equal to $1 \times 10^{-9}$ $cm^{-3}$.

In contrast, the carrier density of the oxide semiconductor is preferably increased in order to improve the on-state current of the transistor or improve the field-effect mobility of the transistor. In order to increase the carrier density of the oxide semiconductor, the impurity concentration or the density of defect states in the oxide semiconductor is slightly increased. Alternatively, the bandgap of the oxide semiconductor is preferably narrowed. For example, an oxide semiconductor that has a slightly high impurity concentration or a slightly high density of defect states in the range where a favorable on/off ratio is obtained in the $I_d$–$V_g$ characteristics of the transistor can be regarded as substantially intrinsic. Furthermore, an oxide semiconductor that has a high electron affinity and thus has a narrow bandgap so as to increase the density of thermally excited electrons (carriers) can be regarded as substantially intrinsic. Note that a transistor using an oxide semiconductor with higher electron affinity has lower threshold voltage.

The aforementioned oxide semiconductor with an increased carrier density has somewhat n-type conductivity; thus, it can be referred to as a "slightly-n" oxide semiconductor.

The carrier density of a substantially intrinsic oxide semiconductor is preferably higher than or equal to $1 \times 10^5$ cm$^{-3}$ and lower than $1 \times 10^{18}$ cm$^{-3}$, further preferably higher than or equal to $1 \times 10^7$ cm$^{-3}$ and lower than or equal to $1 \times 10^{17}$ cm$^{-3}$, still further preferably higher than or equal to $1 \times 10^9$ cm$^{-3}$ and lower than or equal to $5 \times 10^{16}$ cm$^{-3}$, yet further preferably higher than or equal to $1 \times 10^{10}$ cm$^{-3}$ and lower than or equal to $1 \times 10^{16}$ cm$^{-3}$, and yet still preferably higher than or equal to $1 \times 10^{11}$ cm$^{-3}$ and lower than or equal to $1 \times 10^{15}$ cm$^{-3}$.

This embodiment can be combined with any of the other embodiments as appropriate.

Embodiment 8

A semiconductor device of one embodiment of the present invention can be used for display devices, personal computers, or image reproducing devices provided with recording media (typically, devices that reproduce the content of recording media such as digital versatile discs (DVD) and have displays for displaying the reproduced images). Furthermore, as electronic devices that can include the semiconductor device of one embodiment of the present invention, cellular phones, game machines (including portable game machines), portable information terminals, e-book readers, cameras such as video cameras and digital still cameras, goggle-type displays (head mounted displays), navigation systems, audio reproducing devices (e.g., car audio players and digital audio players), copiers, facsimile machines, printers, multifunction printers, automated teller machines (ATM), vending machines, and the like can be given. FIGS. 24A to 24F illustrate specific examples of these electronic devices.

Figure 24A:
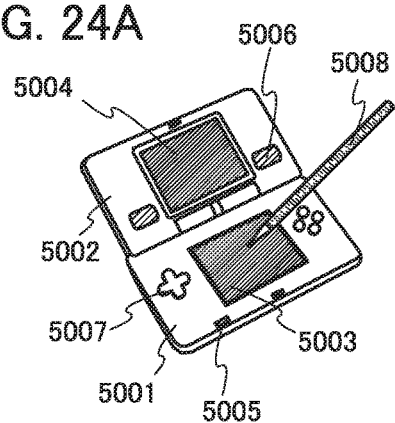
FIGS. 24A to 24F illustrate electronic devices.

FIG. 24A illustrates a portable game machine, which includes a first housing 5001, a second housing 5002, a display portion 5003, a display portion 5004, a microphone 5005, a speaker 5006, an operation key 5007, a stylus 5008, and the like. Note that although the portable game machine in FIG. 24A has the two display portions 5003 and 5004, the number of display portions included in the portable game machine is not limited thereto.

Figure 24B:
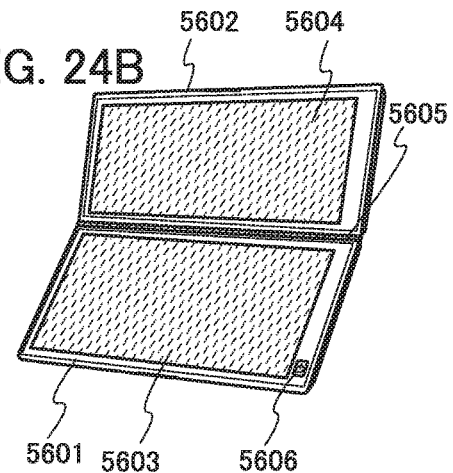

FIG. 24B illustrates a personal digital assistant, which includes a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and the angle between the first housing 5601 and the second housing 5602 can be changed with the joint 5605. An image on the first display portion 5603 may be switched depending on the angle between the first housing 5601 and the second housing 5602 at the joint 5605.

Figure 24C:
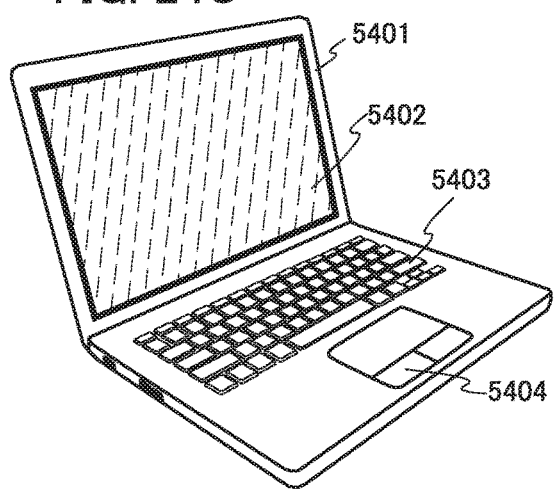

FIG. 24C illustrates a laptop personal computer, which includes a housing 5401, a display portion 5402, a keyboard 5403, a pointing device 5404, and the like.

Figure 24D:
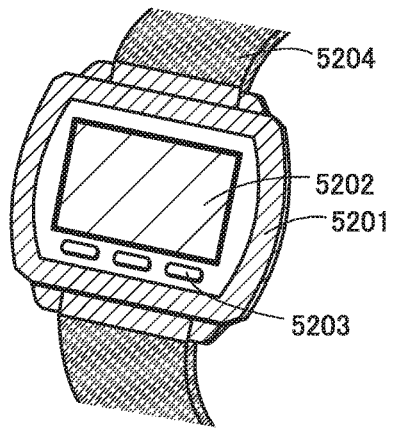

FIG. 24D illustrates a wristwatch, which includes a housing 5201, a display portion 5202, an operation button 5203, a band strap 5204, and the like.

Figure 24E:
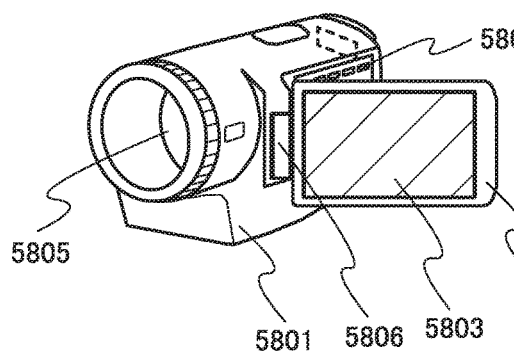

FIG. 24E illustrates a video camera, which includes a first housing 5801, a second housing 5802, a display portion 5803, an operation key 5804, a lens 5805, a joint 5806, and the like. The operation key 5804 and the lens 5805 are provided in the first housing 5801, and the display portion 5803 is provided in the second housing 5802. The first housing 5801 and the second housing 5802 are connected to each other with the joint 5806, and the angle between the first housing 5801 and the second housing 5802 can be changed with the joint 5806. An image on the display portion 5803 may be switched depending on the angle between the first housing 5801 and the second housing 5802 at the joint 5806.

Figure 24F:
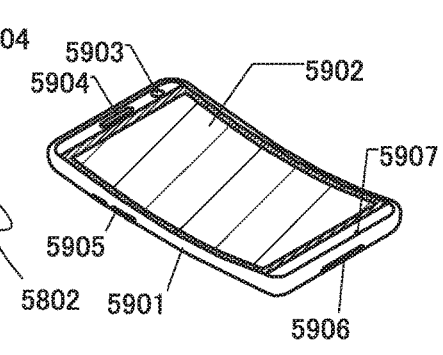

FIG. 24F illustrates a cellular phone, which includes a display portion 5902, a microphone 5907, a speaker 5904, a camera 5903, an external connection port 5906, and an operation button 5905 in a housing 5901.

REFERENCE NUMERALS

10: transmitter, 11: semiconductor device, 12: encoder, 13: difference determination circuit, 14: decoder, 15: signal generation circuit, 16: display device, 17: analysis circuit, 18: arithmetic circuit, 19: signal processing circuit, 20: header adding circuit, 21: subtraction circuit, 22: frame memory, 23: frame memory, 30: pixel portion, 31: driver circuit, 32: driver circuit, 33: pixel, 34: liquid crystal element, 35: transistor, 36: capacitor, 37: controller, 38: frame memory, 39: counter, 40: block dividing circuit, 41: DCT circuit, 42: quantization circuit, 43: entropy coding circuit, 44: inverse quantization circuit, 45: iDCT circuit, 46: addition circuit, 47: interframe prediction circuit, 48: intraframe prediction circuit, 50: system-layer header analysis circuit, 52: entropy decoding circuit, 53: addition circuit, 54: in-loop filter, 55: intraframe prediction circuit, 56: interframe prediction circuit, 57: inverse quantization circuit, 58: iDCT circuit, 60: image data, 60p: pixel, 61p: pixel, 71: memory bank, 95: transistor, 96: transistor, 97: capacitor, 98: light-emitting element, 122: insulating film, 126: insulating film, 127: insulating film, 128: nitride insulating film, 129: insulating film, 131: substrate, 140: conductive film, 141: oxide semiconductor film, 142: metal oxide film, 143: conductive film, 144: conductive film, 145: conductive film, 146: substrate, 147: blocking film, 148: coloring layer, 150: resin film, 151: alignment film, 152: alignment film, 153: liquid crystal layer, 158: opening portion, 159: conductive film, 161: conductive film, 162: opening portion, 260: CMOS layer, 261: transistor layer, 501: transistor, 502: transistor, 503: transistor, 504: driver circuit, 511: insulating layer, 512e: Ec, 512: insulating layer, 513e: Ec, 513: insulating layer, 514: insulating layer, 515: insulating layer, 516e: Ec, 516: insulating layer, 517e: Ec, 517: insulating layer, 518: insulating layer, 519: insulating layer, 520: oxide layer, 521e: Ec, 521: metal oxide film, 522e: Ec, 522: metal oxide film, 523e: Ec, 523: metal oxide film, 526e: trap state Et, 527e: trap state Et, 530: conductive layer, 540: conductive layer, 541: conductive layer, 542: conductive layer, 543: conductive layer, 544: conductive layer, 560: single crystal silicon wafer, 600: frame memory, 601: controller, 602: memory array, 603: memory cell, 603-1: memory cell, 603-2: memory cell, 603a: memory cell, 603b: memory cell, 603p: memory cell group, 603q: memory cell group, 604: driver circuit, 605: input-output buffer, 606: main amplifier, 607: column decoder, 608: switch circuit, 609: precharge circuit, 610: sense amplifier, 610-1: sense amplifier, 610-4: sense amplifier, 611: writing circuit, 612: row decoder, 613: transistor, 614: capacitor, 615: transistor, 616: transistor, 617: transistor, 618: transistor, 619: transistor, 620: transistor, 621: transistor, 622: transistor, 623: transistor, 630a: region, 630b: region, 5001: first housing, 5002: second housing, 5003: display portion, 5004: display portion, 5005: microphone, 5006: speaker, 5007: operation key, 5008: stylus, 5201: housing, 5202: display portion, 5203: operation button, 5204: band strap, 5401: housing, 5402: display portion, 5403: keyboard, 5404: pointing device, 5601: first housing, 5602: second housing, 5603: first display portion, 5604: second display portion, 5605: joint, 5606: operation key, 5801: first housing, 5802: second housing, 5803: display portion, 5804: operation key, 5805: lens, 5806: joint, 5901: housing, 5902: display portion, 5903: camera, 5904: speaker, 5905: button, 5906: external connection port, 5907: microphone This application is based on Japanese Patent Application serial No. 2015-256595 filed with Japan Patent Office on Dec. 28, 2015, the entire contents of which are hereby incorporated by reference.

The invention claimed is:

1. A transmission system comprising:
a first semiconductor device comprising an encoder and a difference determination circuit; and
a second semiconductor device comprising a decoder, a signal generation circuit and a display device,
wherein:
the encoder is configured to obtain difference information by comparing first image data and second image data, and to encode the first image data by using the difference information,
the difference determination circuit is configured to generate data on whether the first image data and the second image data are identical with each other or not by using the difference information and to add the data to the encoded first image data,
the decoder comprises an analysis circuit and an arithmetic circuit,
the analysis circuit is configured to determine whether to decode the encoded first image data sent from the first semiconductor device or not by using the data sent from the first semiconductor device,
the signal generation circuit is configured to generate a signal comprising an instruction on whether to decode the encoded first image data in response to the determination of the analysis circuit,
the arithmetic circuit is configured to decode the encoded first image data in response to the signal, and
the display device is configured to change a length of a frame period and maintain an image displayed on the display device when the encoded first image data is not decoded in the arithmetic circuit.

2. The transmission system according to claim 1, wherein:
the display device comprises a first transistor, a liquid crystal element and a pixel, and
the first transistor comprises an oxide semiconductor in a channel formation region.

3. The transmission system according to claim 1, wherein:
the display device comprises a frame memory,
the frame memory comprises a second transistor and a capacitor in a memory cell, and
the second transistor comprises an oxide semiconductor in a channel formation region.

4. The transmission system according to claim 1, wherein:
the decoder comprises a frame memory,
the frame memory comprises a third transistor and a capacitor in a memory cell, and
the third transistor comprises an oxide semiconductor in a channel formation region.

5. A semiconductor device comprising:
a decoder, a signal generation circuit and a display device,
wherein:
the decoder comprises an analysis circuit and an arithmetic circuit,
the analysis circuit is configured to receive encoded first image data, that includes added data on whether first image data and second image data are identical with each other or not by using difference information, to determine whether to decode received first image data or not by using received added data,
the signal generation circuit is configured to generate a signal comprising an instruction on whether to decode the first image data in response to the determination of the analysis circuit,
the arithmetic circuit is configured to decode the first image data in response to the signal, and
the display device is configured to change a length of a frame period and maintain an image displayed on the display device when the first image data is not decoded in the arithmetic circuit.

6. The semiconductor device according to claim 5, wherein:
the display device comprises a first transistor, a liquid crystal element and a pixel, and
the first transistor comprises an oxide semiconductor in a channel formation region.

7. The semiconductor device according to claim 5, wherein:
the display device comprises a frame memory,
the frame memory comprises a second transistor and a capacitor in a memory cell, and
the second transistor comprises an oxide semiconductor in a channel formation region.

8. The semiconductor device according to claim 5, wherein:
the decoder comprises a frame memory,
the frame memory comprises a third transistor and a capacitor in a memory cell, and
the third transistor comprises an oxide semiconductor in a channel formation region.

* * * * *